United States Patent
Suzuki et al.

(10) Patent No.: US 7,619,230 B2
(45) Date of Patent: Nov. 17, 2009

(54) CHARGED PARTICLE BEAM WRITING METHOD AND APPARATUS AND READABLE STORAGE MEDIUM

(75) Inventors: Junichi Suzuki, Shizuoka (JP); Keiko Emi, Ibaraki (JP); Takayuki Abe, Kanagawa (JP); Tomohiro Iijima, Shizuoka (JP); Hideyuki Tsurumaki, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 289 days.

(21) Appl. No.: 11/535,725

(22) Filed: Sep. 27, 2006

(65) Prior Publication Data

US 2007/0114459 A1 May 24, 2007

(30) Foreign Application Priority Data

Oct. 26, 2005 (JP) ............................. 2005-310889
Jun. 27, 2006 (JP) ............................. 2006-176105

(51) Int. Cl.
*G21K 5/10* (2006.01)
*H01J 37/00* (2006.01)

(52) U.S. Cl. ............................. 250/492.22; 250/492.2; 250/492.3; 716/21

(58) Field of Classification Search ............. 250/396 R, 250/492.1, 492.2, 492.3, 492.21, 492.22, 250/492.23, 492.24; 716/19–21
See application file for complete search history.

(56) References Cited

U.S. PATENT DOCUMENTS 5,149,975 A * 9/1992 Yoda et al. ............... 250/492.2
5,278,421 A * 1/1994 Yoda et al. ............. 250/492.22
6,630,681 B1 * 10/2003 Kojima .................. 250/492.22
6,815,693 B2 * 11/2004 Kamijo et al. ............ 250/491.1
6,835,937 B1 * 12/2004 Muraki et al. ........... 250/396 R
2002/0005494 A1 * 1/2002 Kamijo et al. ............ 250/491.1
2003/0146397 A1 * 8/2003 Yoda et al. ............. 250/492.22
2004/0089822 A1 * 5/2004 Ogasawara ............ 250/492.22
2007/0114453 A1 * 5/2007 Emi et al. ................ 250/492.2
2007/0114459 A1 * 5/2007 Suzuki et al. .......... 250/492.22
2007/0187624 A1 * 8/2007 Suzuki et al. .......... 250/492.22
2007/0192757 A1 * 8/2007 Emi et al. ..................... 716/20
2008/0182185 A1 * 7/2008 Abe et al. ..................... 430/30

FOREIGN PATENT DOCUMENTS

JP        2000-267259       9/2000

* cited by examiner

*Primary Examiner*—Bernard E Souw
(74) *Attorney, Agent, or Firm*—Oblon, Spivak, McClelland, Maier & Neustadt, L.L.P.

(57) ABSTRACT

A charged particle beam writing method includes inputting pattern data for writing a writing region, predicting a writing time for writing the pattern of the pattern data, acquiring, by using a correlation among a time required from a writing start time, the predicted writing time and a base dose of a charged particle beam, a base dose of the charged particle beam after an optional time from a writing start in the case in which the pattern are written, acquiring, by using a correlation among the time required from the writing start time, the predicted writing time and a proximity effect correction coefficient, a proximity effect correction coefficient after an optional time from the writing start in the case in which the pattern are written, calculating, by using the base dose and the proximity effect correction coefficient after the optional time, an exposure dose of the charged particle beam after an optional time from a writing start in the writing time, and writing an optional position in the writing region by using the charged particle beam corresponding to the dose.

15 Claims, 18 Drawing Sheets

Correction based on $cd(t) = CD_0 + \alpha(t_w - t)$

Mask 1
Writing time : 3H

Mask 2
Writing time : 10H $CD_B = CD_D < CD_A < CD_C$
if a CD deterioration generated by leaving after writing is a cause

| Time | Base Dose | $\eta$ |
|---|---|---|
| 0 | B1 | e1 |
| 1 | B2 | e2 |
| : | : | : |

$$\begin{cases} BaseDose(t) = F\left[cd(t)\right] \\ \eta(t) = G\left[cd(t)\right] \end{cases}$$

FIG. 14

$$\begin{cases} D(x,y) = BaseDose(t) \times (d_0 + d_1 + d_2 + d_3 + \ldots); \\ d_0 = \dfrac{1/2 + \eta(t)}{1/2 + U(x,y) \times \eta(t)} \\ d_i = \dfrac{\eta(t) \times d_0(x,y)}{1/2 + \eta(t)} \left[d_{i-1}(x,y)U(x,y) - V_i(x,y)\right] \\ U(x,y) = \iint\limits_{pattern} g(x-x', y-y')\, dx'\, dy' \\ V_i(x,y) = \iint\limits_{pattern} d_{i-1}(x', y')\, g(x-x', y-y')\, dx'\, dy' \end{cases}$$

FIG. 15

$$g(x, y) = \frac{1}{\pi\sigma^2} \exp\left[\frac{-(x^2+y^2)}{\sigma^2}\right]$$

FIG. 16

CHARGED PARTICLE BEAM WRITING METHOD AND APPARATUS AND READABLE STORAGE MEDIUM

CROSS-REFERENCE TO RELATED APPLICATION

This application is based upon and claims the benefit of priority from the prior Japanese Patent Application No. 2005-310889 filed on Oct. 26, 2005 in Japan and the prior Japanese Patent Application No. 2006-176105 filed on Jun. 27, 2006 in Japan, the entire contents of which are incorporated herein by reference.

BACKGROUND OF THE INVENTION

1. Field of the Invention

The present invention relates to a charged particle beam writing method, a readable storage medium and a charged particle beam writing apparatus, and more particularly to a technique for obtaining an amount of an irradiation of an electron beam to enhance a line width uniformity in electron beam writing.

2. Related Art

A lithographic technique for progressing a microfabrication of a semiconductor device is only one of very important processes for generating a pattern in a semiconductor manufacturing process. In recent years, circuit line widths required for the semiconductor devices have been reduced every year with an increase in an integration of an LSI. In order to form desirable circuit patterns on these semiconductor devices, an original picture pattern (which will also be referred to as a reticle or a mask) with high precision is required. The electron beam writing technique has an originally excellent developing property, and is used for producing the original picture pattern with high precision.

FIG. 25 is a conceptual view for explaining an operation of a conventional variable-shaped electron beam writing apparatus.

A rectangle, for example, oblong opening 411 for forming an electron beam 330 is provided on a first aperture 410 in a variable-shaped electron beam writing apparatus (EB (Electron Beam) writing apparatus). Moreover, a variable-shaped opening 421 for forming the electron beam 330 transmitted through the opening 411 of the first aperture 410 to have a desirable rectangular shape is provided on a second aperture 420. The electron beam 330 irradiated from a charged particle source 430 and transmitted through the opening 411 of the first aperture 410 is deflected by means of a deflector, and is transmitted through a part of the variable-shaped opening 421 of the second aperture 420 and is thus irradiated on a target workpiece 340 mounted on a stage to be continuously moved in a predetermined direction (which is assumed to be an X direction, for example). More specifically, the rectangular shape in which the electron beam 330 can be transmitted through both of the opening 411 of the first aperture 410 and the variable forming opening 421 of the second aperture 420 is drawn in a writing region of the target workpiece 340 mounted on the stage to be continuously moved in the X direction. A method of transmitting the electron beam 330 through both of the opening 411 of the first aperture 410 and the variable forming opening 421 of the second aperture 420, thereby creating an optional form is referred to as a variable-shaped method.

In recent years, there has been a chemical amplification type resist as one of resists used often for an electron beam exposure. The chemical amplification type resist has a problem in that an optimum amount of an exposed dose is changed by leaving before and after the exposure. As a technique for solving the problem, a change in a resist sensitivity is determined by measuring a film thickness and the like of a corrected exposure pattern. A technique for carrying out an irradiation through a blurred beam having a beam diameter of approximately 20 μm again has been disclosed (see JP-A-2000-267259, for example).

As described above, the chemical amplification type resist has a problem in that the optimum amount of the exposed dose is changed by leaving before and after the exposure. In other words, in the case in which the chemical amplification type resist is used for manufacturing a mask, a line width dimension (CD) obtained after the writing of the mask to be a workpiece fluctuates (PED).

In the technique described in JP-A-2000-267259, there is a problem in that a correction with high precision cannot be carried out because a dose error for each pattern category is made. Moreover, there is a problem in that a pattern for determining an amount of a corrected exposure is necessary and a film thickness measuring device and an exposure auxiliary chamber are required in addition to an exposing apparatus body.

It can be supposed that the fluctuation (PED) in the line width dimension (CD) obtained after the writing of the mask is caused by a diffusion of acid generated by the writing. The diffusion of the acid is caused in a region of several tens nm and has a rate of approximately of 1.0 nm/h. On the other hand, in the electron beam writing, it has been known that the CD error for each pattern depending on an area density is made by a proximity effect (a range of several tens μm). It is necessary to change and correct an exposure dose or "irradiation amount" for each area density in order to correct the proximity effect, and a base dose and a proximity effect correction coefficient η are used. There can also be proposed a technique for predicting the CD error of a pattern based on a time and writing pattern data obtained by previously resizing pattern data, thereby correcting the fluctuation (PED) of the line width dimension (CD) obtained after the writing of the mask in the case in which a writing order for a pattern or a chip to be written on the workpiece can be controlled. However, there is a problem in that a very long time is required for resizing the pattern and a date volume is also increased.

BRIEF SUMMARY OF THE INVENTION

It is an object of the present invention to provide a technique for obtaining a dose to correct a fluctuation in a line width dimension (CD) acquired after the writing of a mask.

In accordance with an aspects of the invention, a charged particle beam writing method includes inputting pattern data for writing a writing region, predicting a writing time for writing the pattern of the pattern data, acquiring, by using a correlation among a time required from a writing start time, the predicted writing time and a base dose of a charged particle beam, a base dose of the charged particle beam after an optional time from a writing start in the case in which the pattern are written, acquiring, by using a correlation among the time required from the writing start time, the predicted writing time and a proximity effect correction coefficient, a proximity effect correction coefficient after an optional time from the writing start in the case in which the pattern are written, calculating, by using the base dose and the proximity effect correction coefficient after the optional time, an exposure dose of the charged particle beam after an optional time from a writing start in the writing time, and writing an optional position in the writing region by using the charged particle beam corresponding to the exposure dose.

In accordance with other aspects of the invention, a charged particle beam writing method includes inputting pattern data for writing a writing region, virtually dividing the writing region like a mesh in a predetermined dimension, creating a predicting time map required for starting writing of each mesh region in the writing region from a writing start time based on the pattern data, creating a base dose map in the each mesh region in the case in which the pattern are written based on a correlation between a time required from the writing start time and a base dose of a charged particle beam, creating a proximity effect correction coefficient map in the each mesh region in the case in which the pattern are written based on a correlation between the time required from the writing start time and a proximity effect correction coefficient, calculating an exposure dose in the each mesh region by using the base dose map and the proximity effect correction coefficient map, and writing the each mesh region by using the charged particle beam corresponding to the exposure dose.

In accordance with a further aspects of the invention, a readable storage medium storing a program for causing a computer to execute processes. The processes includes a storage processing for storing, in a storage device, first correlation information of a pattern line width and a base dose of a charged particle beam and second correlation information of the pattern line width and a proximity effect correction coefficient, an input processing for inputting pattern data to write a writing region, a time calculation processing for calculating a writing time to write the pattern based on the pattern data, a base dose acquirement processing for reading the first correlation information from the storage device and acquiring a base dose corresponding to the pattern line width after an optional time required from a writing start in the writing time in the case in which the pattern are written, a proximity effect correction coefficient acquirement processing for reading the second correlation information from the storage device and acquiring a proximity effect correction coefficient corresponding to the pattern line width after an optional time required from a writing start in the writing time in the case in which the pattern are written, and an exposure dose calculation processing for calculating an exposure dose after the optional time by using the base dose and the proximity effect correction coefficient corresponding to the pattern line width after the optional time.

In accordance with a further aspects of the invention, a charged particle beam writing apparatus includes a writing time predicting unit for predicting, based on the pattern data for writing a writing region, a writing time to write pattern of the pattern data by using a charged particle beam, a base dose acquiring unit for acquiring, by using a correlation among a time required from a writing start time, the predicted writing time and a base dose of the charged particle beam, a base dose of the charged particle beam after an optional time from a writing start in the case in which the pattern of the pattern data are written, a proximity effect correction coefficient acquiring unit for acquiring, by using a correlation among the time required from the writing start time, the predicted writing time and a proximity effect correction coefficient, a proximity effect correction coefficient after an optional time from the writing start in the case in which the pattern are written, an exposure dose calculating unit for calculating an exposure dose after the optional time by using the base dose and the proximity effect correction coefficient after the optional time, an irradiation time calculating unit for calculating an irradiation time of the charged particle beam in each position in the writing region based on the exposure dose, a deflector for deflecting the charged particle beam corresponding to the irradiation time, and an aperture for shielding the charged particle beam deflected by the deflector.

BRIEF DESCRIPTION OF THE DRAWINGS

FIG. 14 shows an example of a table according to the first embodiment, FIG. 15 shows an equation for calculating a dose Dp obtained after a proximity effect correction according to the first embodiment, FIG. 16 shows an example of a distribution function equation g (x, y) according to the first embodiment.

DETAILED DESCRIPTION OF THE INVENTION

A structure using an electron beam will be described below as an example of a charged particle beam in an embodiment. The charged particle beam is not restricted to the electron beam but may be a beam using a charged particle such as an ion beam.

First Embodiment

Figure 1:
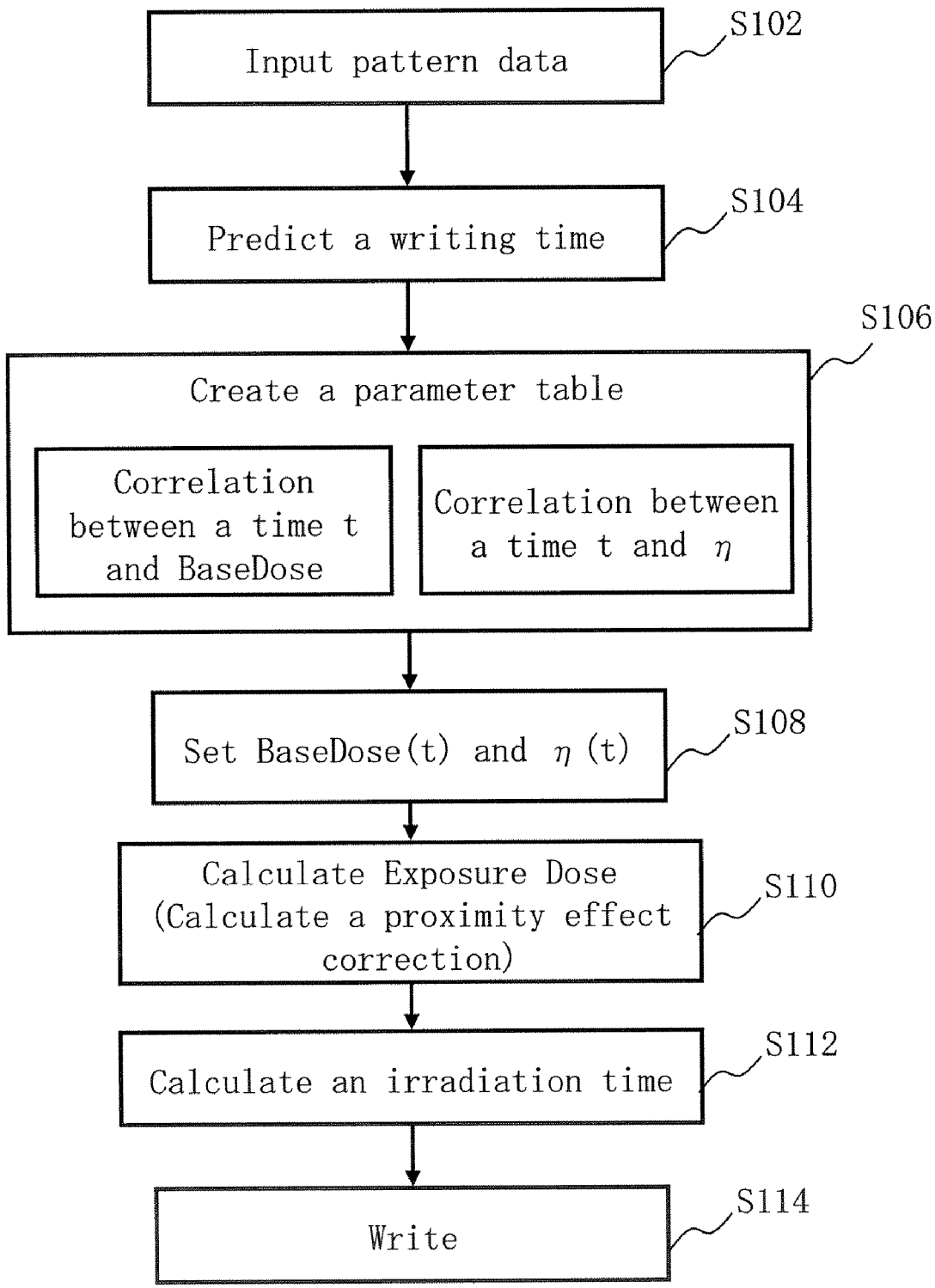
FIG. 1 is a flowchart showing steps of a main part in an electron beam writing method according to a first embodiment.

FIG. 1 is a flowchart showing steps of a main part in an electron beam writing method according to a first embodiment of the present invention.

In FIG. 1, the electron beam writing method executes a serial steps including a pattern data inputting step (S102), a writing time predicting step (S104), a parameter table creating step (S106) according to an example of a base dose acquiring step and a proximity effect correction coefficient acquiring step, a base dose BaseDose(t) of the electron beam and proximity effect correction coefficient η(t) setting step (S108), an exposure dose calculating step (S110), an irradiation time calculating step (S112) and a writing step (S114).

Figure 2:
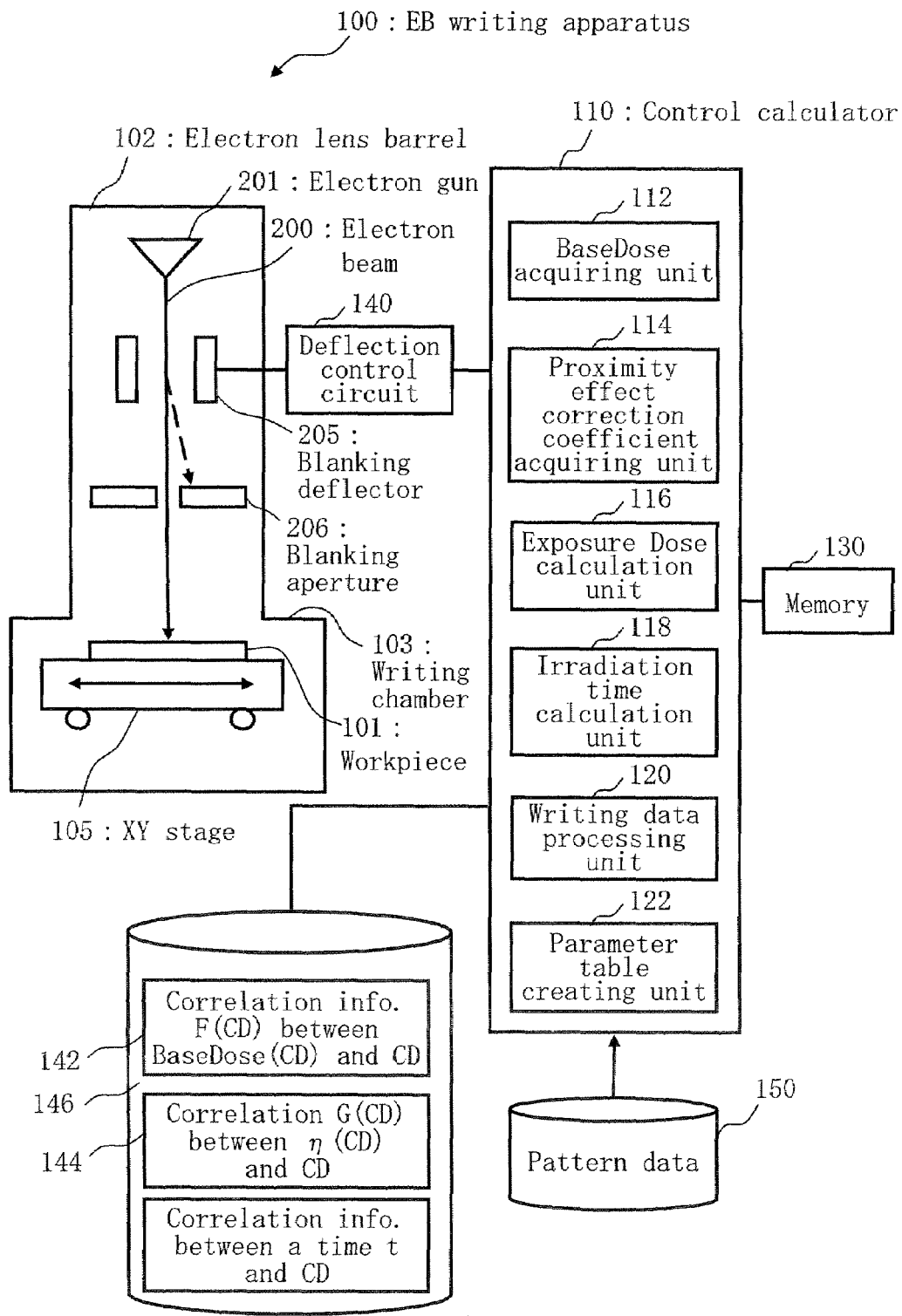
FIG. 2 is a conceptual diagram showing an example of a structure of a main part in an EB writing apparatus according to the first embodiment.

FIG. 2 is a conceptual diagram showing an example of a structure of a main part in an EB writing apparatus according to the first embodiment.

In FIG. 2, an EB writing apparatus 100 according to an example of a charged particle beam writing apparatus has a writing unit and a control unit. The writing unit includes an electron lens barrel 102 and a writing chamber 103. The electron lens barrel 102 includes an electron gun 201, a blanking deflector 205, and a blanking aperture 206. The writing chamber 103 includes an XY stage 105. The control unit has a control calculator 110, a memory 130 according to an example of a storage device, a magnetic disk device 146 according to an example of the storage device, and a deflection control circuit 140. The control calculator 110 has the functions of a base dose acquiring unit 112, a proximity effect correction coefficient acquiring unit 114, an exposure dose calculating unit 116, an irradiation time calculating unit 118, a writing data processing unit 120, and a parameter table creating unit 122. Pattern data 150 are input to the control calculator 110. Moreover, correlation information 142 between a base dose BaseDose(CD) and a CD and correlation information 144 between a proximity effect correction coefficient η(CD) and the CD are stored in the magnetic disk device 146. In FIG. 2, units other than necessary components for explaining the first embodiment are omitted. It is apparent that the EB writing apparatus 100 usually includes other necessary structures. Although FIG. 2 illustrates that the processing of each of the functions including the base dose acquiring unit 112, the proximity effect correction coefficient acquiring unit 114, the exposure dose calculating unit 116, the irradiation time calculating unit 118, the writing data processing unit 120 and the parameter table creating unit 122 is executed in the control calculator 110 according to an example of a computer, moreover, this it not restricted but it may be executed by a combination of hardware and software through an electrical circuit. Alternatively, it is also possible to apply a combination of the hardware and firmware.

An electron beam 200 according to an example of a charged particle beam emitted from an electron gun 201 and controlled to have a predetermined current density J is irradiated on a desirable position of a target workpiece 101 on the XY stage 105 disposed movably. In order to prevent the electron beam 200 from being excessively incident on the workpiece 101 in the case in which the electron beam 200 on the workpiece 101 reaches an irradiation time required for causing a desirable dose to be incident on the workpiece 101, for example, the electron beam 200 is deflected by the electrostatic type blanking deflector 205 and is cut by the blanking aperture 206 to prevent the electron beam 200 from reaching the workpiece 101 plane, for example. A deflection voltage of the blanking deflector 205 is controlled by the deflection control circuit 140 and an amplifier which is not shown.

In case of beam-ON (blanking OFF), the electron beam 200 emitted from the electron gun 201 advances along a track shown in a solid line of FIG. 2. On the other hand, in case of beam-OFF (blanking ON), the electron beam 200 emitted from the electron gun 201 advances along a track shown in a dotted line in FIG. 2. Moreover, air is evacuated, by means of a vacuum pump (not shown), from the electron lens barrel 102 and the writing chamber 103 in which the XY stage 105 is disposed, and a vacuum atmosphere having a lower pressure than an atmospheric pressure is thus given.

In FIG. 2, the necessary components for explaining the first embodiment are described. In addition to the structure described above, the EB writing apparatus 100 may comprise an illuminating lens, a first aperture, a projection lens, a forming deflector, a second aperture, an objective lens, an objective deflector and the like in the electron lens barrel 102. With the structure, in case of the beam-ON (blanking OFF), the electron beam 200 emitted from the electron gun 201 illuminates the whole first aperture having a rectangular, for example, oblong hole by means of the illuminating lens. Herein, the electron beam 200 is first formed to be rectangle, for example, oblong. Then, the electron beam 200 to be a first aperture image passing through the first aperture is projected onto the second aperture by means of the projection lens. A position of the first aperture image on the second aperture can be controlled by the forming deflector to change a beam shape and a dimension. The electron beam 200 to be a second aperture image passing through the second aperture is focused by the objective lens and is deflected by the objective deflector, and is thus irradiated on a desirable position of the workpiece 101 disposed on the XY stage 105 provided movably. By such a structure, it is possible to obtain a variable-shaped EB writing apparatus.

First of all, there are obtained a correlation between the base dose BaseDose(t) and a time t and a correlation between the proximity effect correction coefficient η(t) and the time t.

Figure 3:
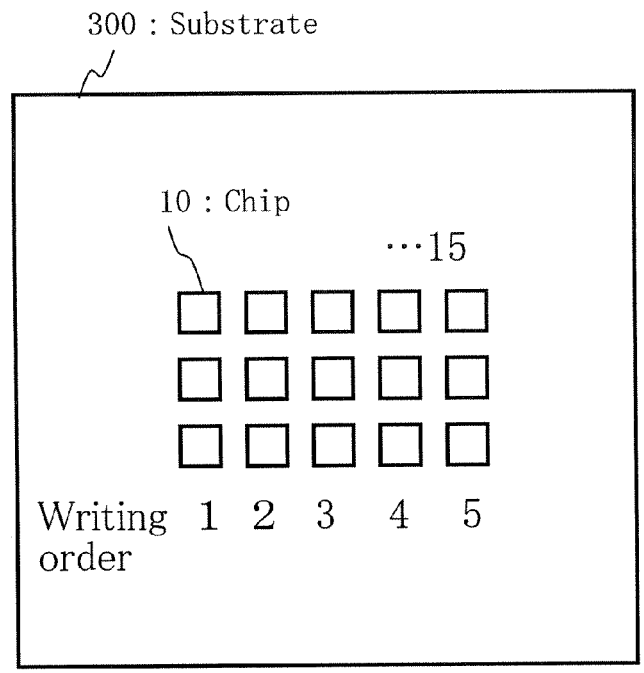
FIG. 3 is a view showing an example of a substrate for a prior experiment in the first embodiment.

FIG. 3 is a view showing an example of a substrate for a prior experiment according to the first embodiment.

In FIG. 3, a plurality of chips 10 having an equal size, for example, 15 chips 10 having a side of 100 μm are drawn on a substrate 300. There is prepared the substrate 300 in which a chromium (Cr) film to be a shielding layer is formed on a transparent glass substrate such as quartz and a chemical amplification type resist film is formed on the Cr film.

Figure 4:
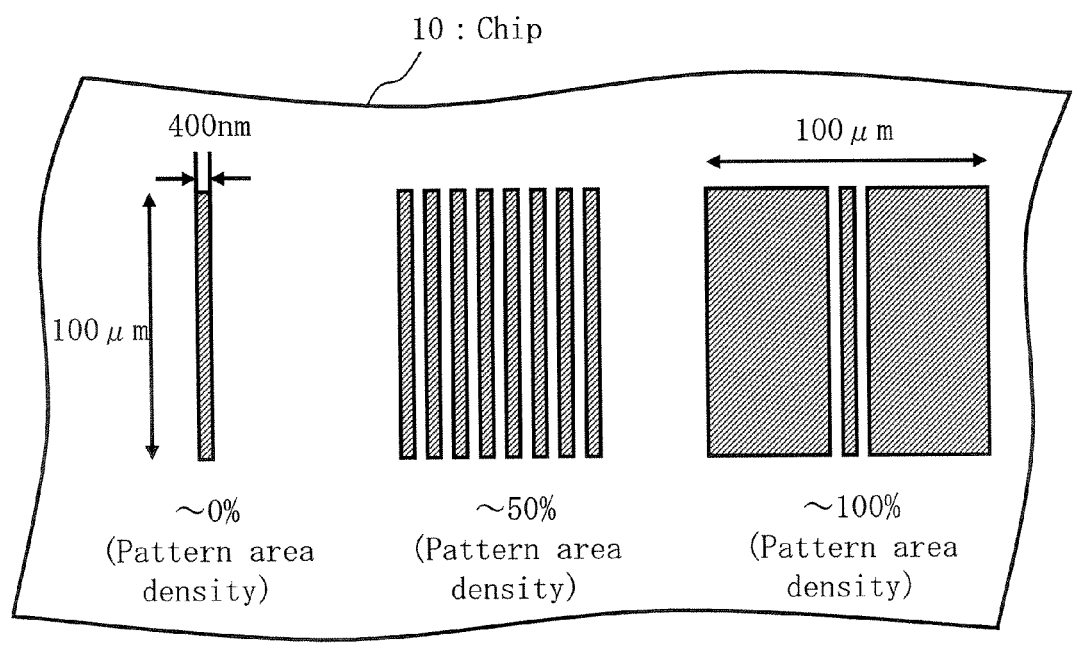
FIG. 4 is a view showing an example of a pattern of each chip in the first embodiment.

FIG. 4 is a view showing an example of a pattern of each chip according to the first embodiment.

On each of the chips 10 shown in FIG. 3, for example, there are written or "formed" a line pattern having a line width dimension of 400 nm in which a pattern area density is approximately 0%, a line pattern having a line width dimension of 400 nm in which the pattern area density is 50%, a line pattern having a line width dimension of 400 nm in which the pattern area density is approximately 100%, and patterns having a pattern density of 100% on the left and right of the line patterns as shown in FIG. 4.

As a writing method, a last chip is written and a next chip is written after one hour, and this operation is repeated to write all of the 15 chips in order. In other words, a chip 1 is written and a chip 2 is written after one hour. Then, the chip 2 is written and a chip 3 is written after one hour. This operation is repeated to write the chips to reach a chip 15.

Figure 5:
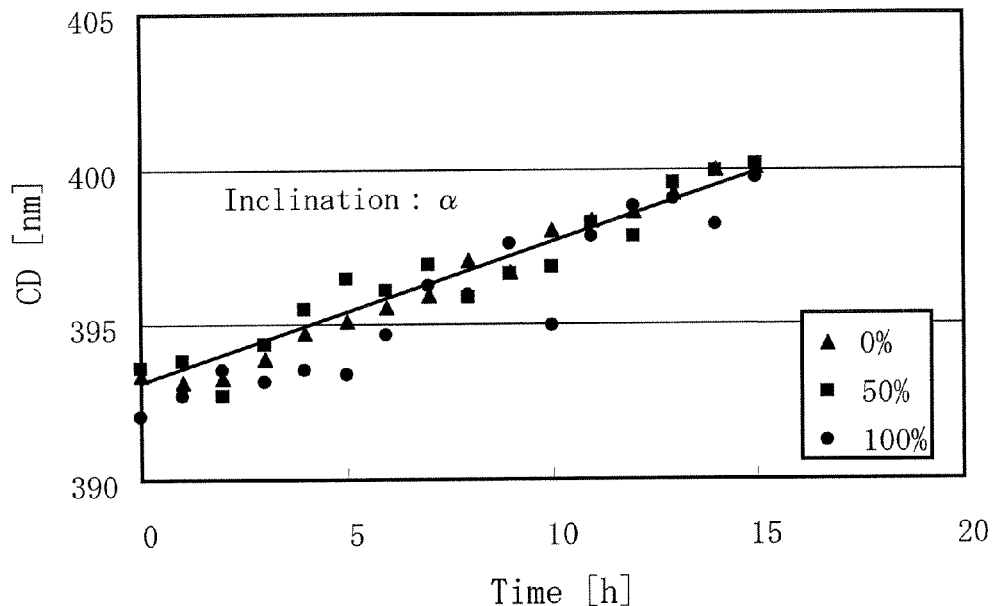
FIG. 5 is a chart showing an example of a graph representing a correlation between a pattern line width dimension CD and a time from a writing start time of a first chip to a writing start time of a desirable chip according to the first embodiment.

FIG. 5 is a chart showing an example of a graph representing a correlation between a pattern line width dimension CD and a time from a writing start time for a first chip to a writing start time of a desirable chip according to the first embodiment.

As shown in FIG. 5, it is apparent that the CD fluctuates with a predetermined inclination α for a pattern area density of 0%, 50% and 100% by leaving after the electron beam writing. In other words, the pattern line width dimension CD can be defined by a function cd(t) in which the time t from the writing start time for the first chip to the writing start time for the desirable chip (which will be hereinafter referred to as a "a time t required from a writing start") is set to be a variable. As an example, there is shown a graph in which the pattern line width dimension CD is primary proportional to the writing start time t of the chip. It is preferable to select an optimum relationship depending on a resist characteristic. Description will be given on the assumption that a time required for writing each chip is sufficiently short and can be disregarded. Accordingly, the description will be given on the assumption that a time required for leaving after a certain chip is written is equivalent to a time required from the writing start time of the chip.

By different experiments, next, there are obtained the correlation between the pattern line width dimension CD and the base dose and the correlation between the pattern line width dimension CD and the proximity effect correction coefficient η.

Figure 6:
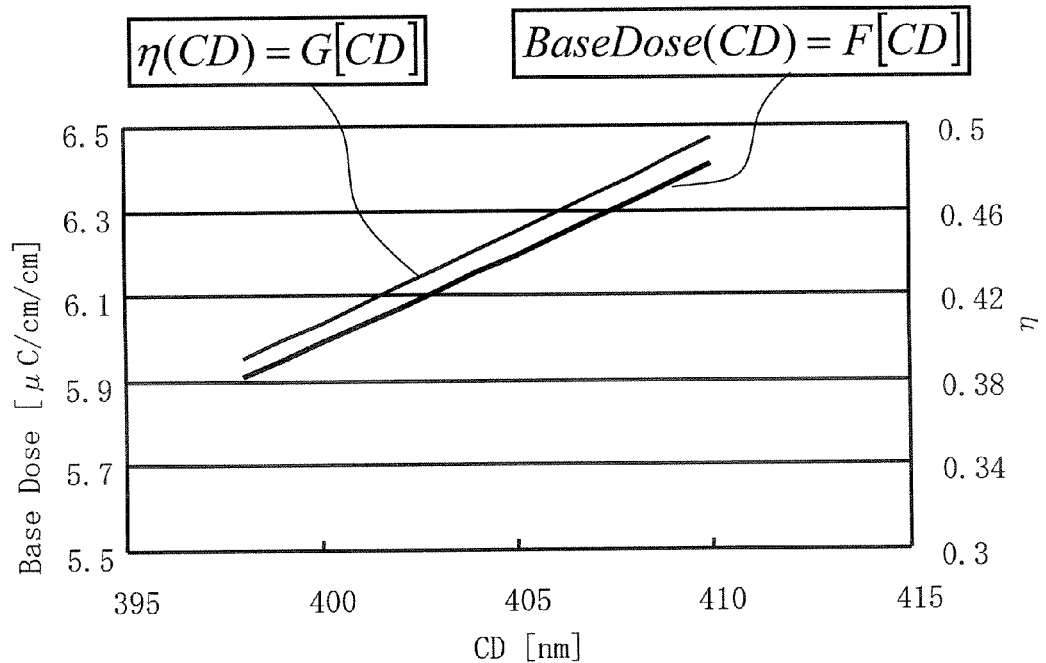
FIG. 6 is a chart showing an example of a graph representing a correlation between the pattern line width dimension CD and a base dose and a correlation between the pattern line width dimension CD and a proximity effect correction coefficient η according to the first embodiment.

FIG. 6 is a chart showing an example of a graph representing the correlation between the pattern line width dimension CD and the base dose and the correlation between the pattern line width dimension CD and the proximity effect correction coefficient η in the first embodiment.

As shown in FIG. 6, the base dose can be defined by a function F(CD) in which the pattern line width dimension CD is set to be a variable. As an example, there is shown a graph in which the base dose is proportional to the pattern line width dimension CD. Similarly, the proximity effect correction coefficient η can be defined by a function G(CD) in which the pattern line width dimension CD is set to be a variable. As an example, there is shown a graph in which the proximity effect correction coefficient η is proportional to the pattern line width dimension CD.

The definition can be carried out with $cd(t)=CD_0+\alpha(t_w-t)$ after a correction, wherein a value obtained after a correction for correcting each CD value shown in FIG. 5 is represented as cd(t), an inclination of the graph shown in FIG. 5 is represented as α, a CD value at time of a writing end, that is, in a leaving time of "0" is represented as $CD_0$, and a time required for writing all of the chips is represented as $t_w$. The base dose BaseDose(t) for writing cd(t) obtained after the correction can be defined with BaseDose(t)=F{cd(t)} based on the function F(CD) described with reference to FIG. 6. Similarly, the proximity effect correction coefficient η(t) for writing cd(t) obtained after the correction can be defined with the proximity effect correction coefficient η(t)=G{cd(t)} based on the function G(CD) described with reference to FIG. 6.

Figure 7:
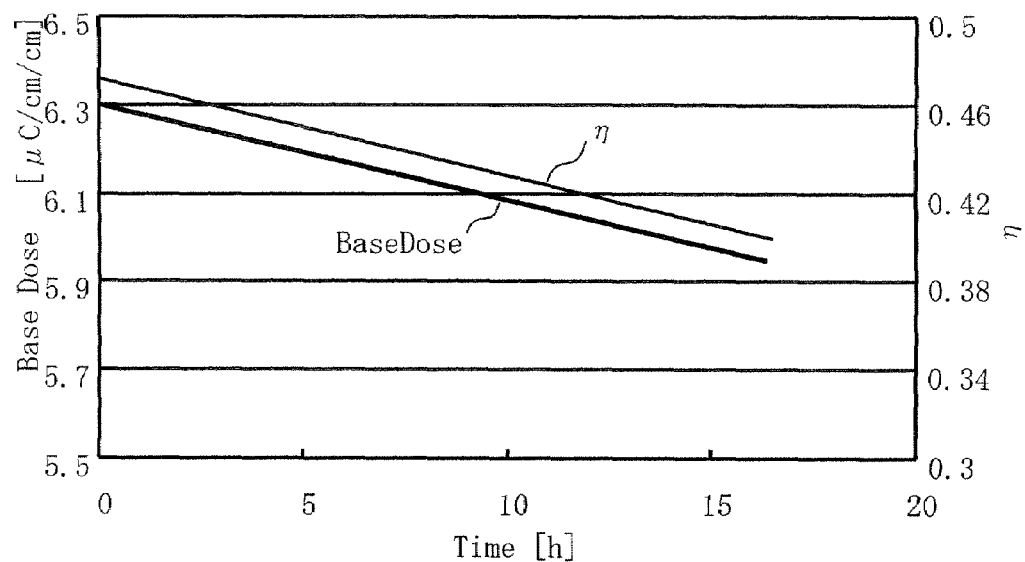
FIG. 7 is a chart showing an example of a graph representing a correlation between the base dose and a time required from a writing start and a correlation between the proximity effect correction coefficient η and the time required from the writing start according to the first embodiment.

FIG. 7 is a chart showing an example of a graph representing the correlation between the base dose and the time required from the writing start and the correlation between the proximity effect correction coefficient η and the time required from the writing start according to the first embodiment.

In the case in which the definition is carried out with BaseDose(t)=F{cd(t)} and η(t)={cd(t)}, it is possible to obtain the graph representing the correlations shown in FIG. 7.

As described above, the correlation between the time t required from the writing start time and the base dose can be obtained based on a relationship between a time required for leaving after the writing and the pattern line width CD changed by the leaving and a relationship between the pattern line width CD and the base dose.

The correlation between the time t required from the writing start time and the proximity effect correction coefficient η can be obtained based on the relationship between a time required for leaving after the writing and the pattern line width CD changed by the leaving and a relationship between the pattern line width CD and the proximity effect correction coefficient η.

Figure 8:
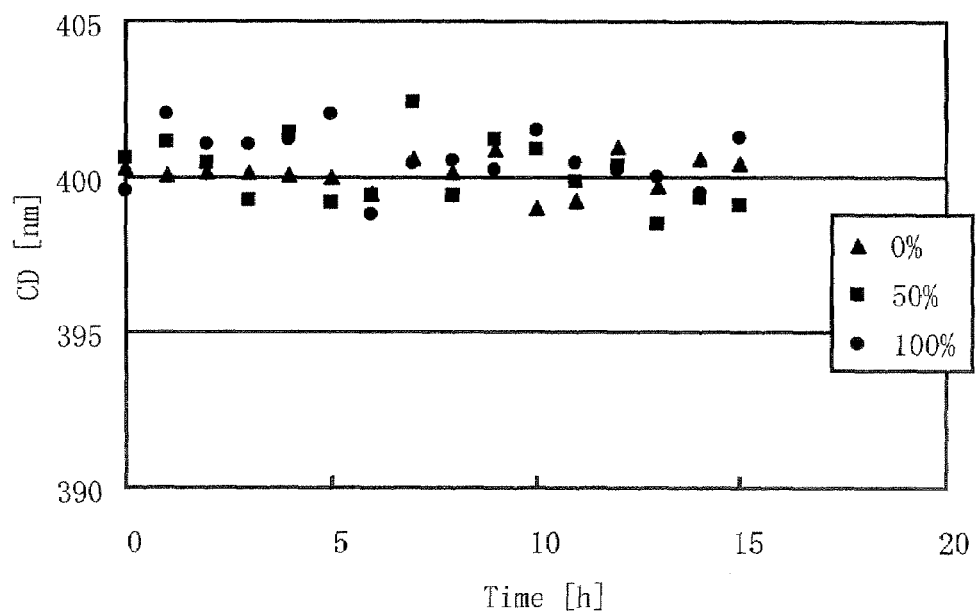
FIG. 8 is a chart showing an example of a graph representing a correlation between the pattern line width dimension CD obtained after a correction and a time t required from the writing start according to the first embodiment.

FIG. 8 is a chart showing an example of a graph representing a correlation between the pattern line width dimension CD obtained after the correction and the time t required from the writing start according to the first embodiment.

In the definition with $cd(t)=CD_0+\alpha(t_w-t)$ obtained after the correction, in the case in which the writing is carried out in a dose acquired by calculating the base dose and the proximity effect correction coefficient η for each chip based on the correlation between the base dose and the time required from the writing start and the correlation between the proximity effect correction coefficient η and the time required from the writing start, it is possible to enhance a line width uniformity in the vicinity of a value of $CD_0$ as shown in FIG. 8.

It is also suitable that the definition should be performed as $cd(t)=CD_{(t=0)}-\alpha \cdot t$ obtained after the correction, wherein the value obtained after the correction for correcting each CD value shown in FIG. 5 is represented as cd(t), the inclination of the graph shown in FIG. 5 is represented as α, and the CD value at time of the writing start, that is, in a time t of "0" is represented as $CD_{(t=0)}$. The base dose BaseDose(t) for writing cd(t) obtained after the correction can be defined with BaseDose(t)=F{cd(t)} based on the function F(CD) described with reference to FIG. 6. Similarly, the proximity effect correction coefficient η(t) for writing cd(t) obtained after the correction can be defined with the proximity effect correction coefficient $\eta(t)=G\{cd(t)\}$ based on the function G(CD) described with reference to FIG. 6.

Figure 9:
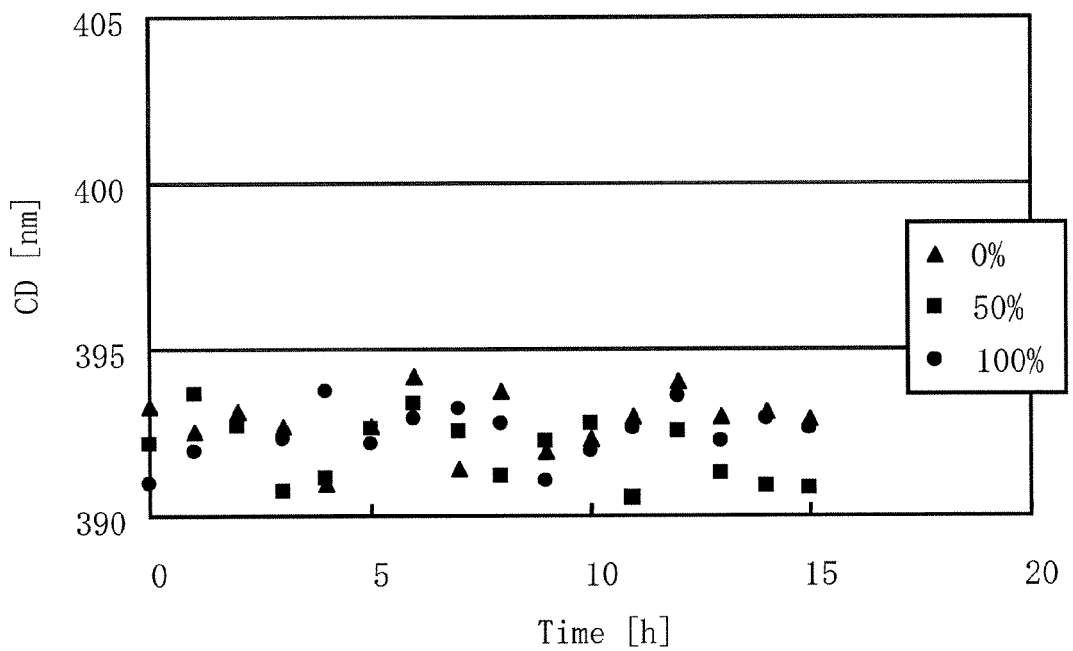
FIG. 9 is a chart showing an example of a graph representing a correlation between the pattern line width dimension CD obtained after the correction and the time t required from the writing start according to the first embodiment.

FIG. 9 is a chart showing an example of a graph representing a correlation between the pattern line width dimension CD obtained after the correction and the time t required from the writing start according to the first embodiment.

In the definition with $cd(t)=CD_{(t=0)}-\alpha \cdot t$ obtained after the correction, in the case in which the writing is carried out in a dose acquired by calculating the base dose and the proximity effect correction coefficient $\eta$ for each chip based on the correlation between the base dose and the time required from the writing start and the correlation between the proximity effect correction coefficient $\eta$ and the time required from the writing start, it is possible to enhance a line width uniformity in the vicinity of a value of $CD_{(t=0)}$ as shown in FIG. 9.

Figure 10:
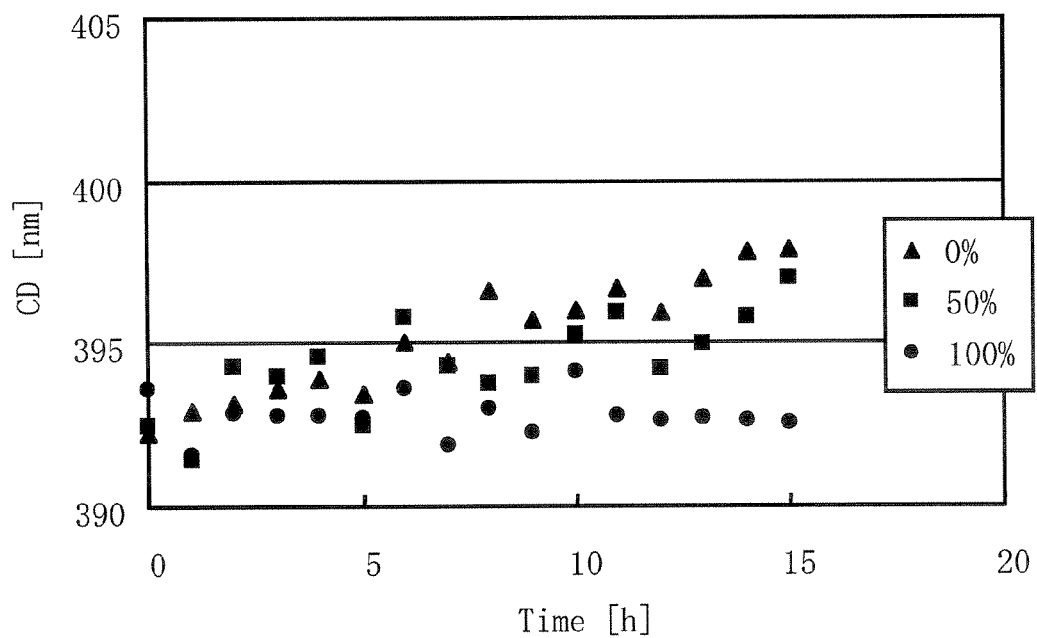
FIG. 10 is a chart showing an example of a graph representing a correlation between the pattern line width dimension CD and the time t required from the writing start in the case in which the correction is carried out by only the base dose according to the first embodiment.

FIG. 10 is a chart showing an example of a graph representing the correlation between the pattern line width dimension CD and the time t required from the writing start in the case in which the correction is carried out with only base dose according to the first embodiment.

It is apparent that the line width uniformity cannot be sufficiently enhanced and the correction cannot be fully carried out with a pattern area density of 0% and 50% in the case in which the correction is carried out with only base dose as shown in FIG. 10. Accordingly, it is desirable that the correction should be carried out by using base dose and the proximity effect correction coefficient.

Figures 11A, 11B:
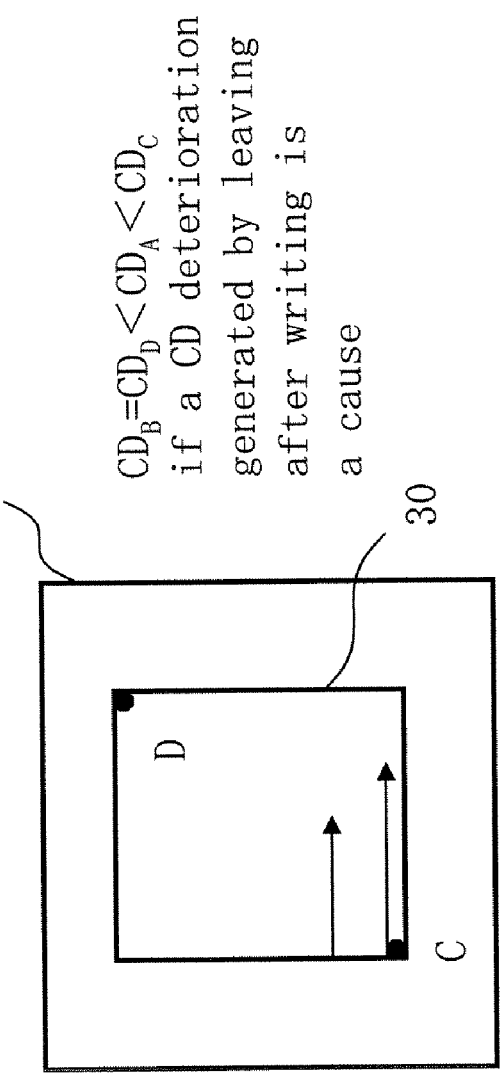
FIGS. 11A and 11B are diagrams for explaining a CD deterioration in the case in which masks having different writing times are drawn according to the first embodiment.

FIGS. 11A and 11B are views for explaining a CD deterioration in the case in which masks having different writing times are drawn according to the first embodiment.

FIG. 11A shows a mask 1 in which a writing time from a writing start point A to a writing end point B takes three hours in a writing region 20 for a target workpiece 101. On the other hand, FIG. 11B shows a mask 2 in which a writing time from a writing start point C to a writing end point D takes 10 hours in a writing region 30 for the workpiece 101. If a CD deterioration generated by leaving after the writing is a cause, $CD_B=CD_D<CD_A<CD_C$ is obtained for a relationship among $CD_A$ to be a CD value obtained by leaving after the writing on a point A, $CD_B$ to be a CD value obtained by leaving after the writing on a point B, $CD_C$ to be a CD value obtained by leaving after the writing on a point C and $CD_D$ to be a CD value obtained by leaving after the writing on a point D.

Figure 12:
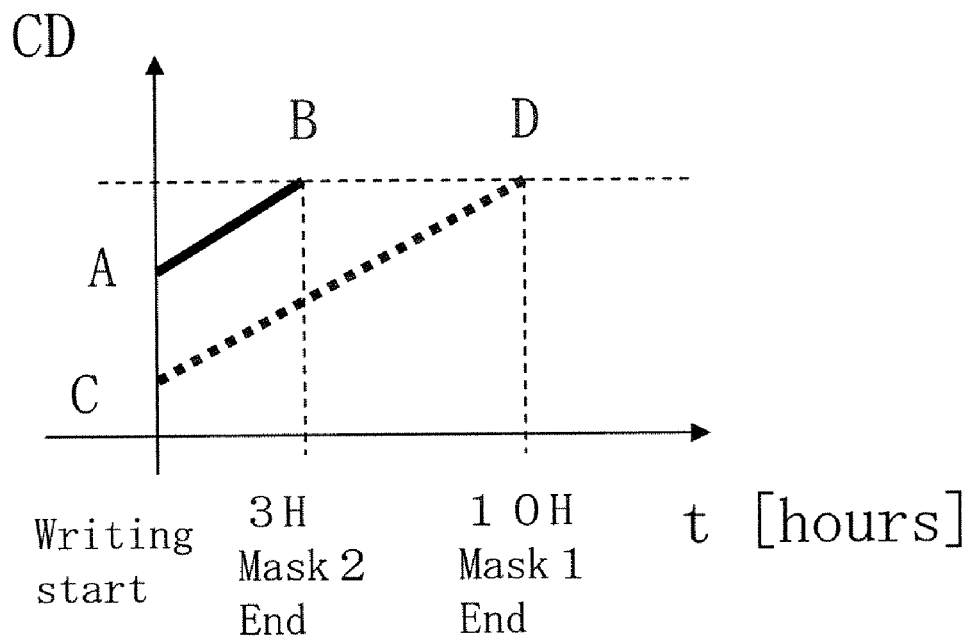
FIG. 12 is a chart showing an example of a graph representing a correlation between the CDs of two masks and the time t required from the writing start in FIGS. 11A and 11B.

FIG. 12 is a chart showing an example of a graph representing a correlation between the CDs of two masks and the time t required from a writing start in FIGS. 11A and 11B.

As shown in FIG. 12, in the CD values on the points A to D before the correction, the point C where a leaving time is the longest takes the smallest CD value. The points B and D where the leaving time is zero take the same value.

Figure 13:
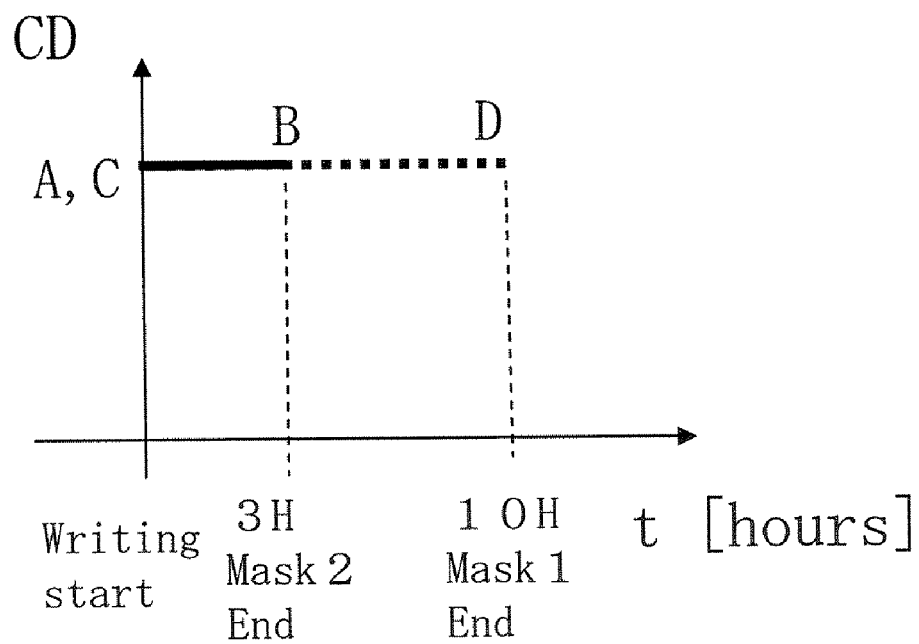
FIG. 13 is a chart showing an example of a graph representing a correlation between a pattern line width dimension CD obtained after a correction and the time t from the writing start for the two masks in FIGS. 11A and 11B.

FIG. 13 is a chart showing an example of a graph representing a correlation between the pattern line width dimension CD obtained after the correction and the time t required from the writing start for the two masks in FIGS. 11A and 11B.

The definition can be carried out with $cd(t)=CD_0+\alpha(t_w-t)$ after a correction, wherein a value obtained after a correction for correcting each CD value is represented as cd(t), an inclination of the graph shown in FIG. 12 is represented as $\alpha$, the CD values on the points B and D where a leaving time after the writing end is "0" are represented as $CD_0$, and a writing time is represented as $t_w$. The base dose BaseDose(t) for writing cd(t) obtained after the correction can be defined with $BaseDose(t)=F\{cd(t)\}$ based on the function F(CD) described with reference to FIG. 6. Similarly, the proximity effect correction coefficient $\eta(t)$ for writing cd(t) obtained after the correction can be defined with the proximity effect correction coefficient $\eta(t)=G\{cd(t)\}$ based on the function G(CD) described with reference to FIG. 6. Between the masks having different writing times, the leaving times are different from each other even if the time t required from the writing start are equal to each other. For this reason, the base doses and the proximity effect correction coefficients $\eta$ are different from each other at the time t. In the case in which the writing is carried out in a dose obtained by calculating the base dose and the proximity effect correction coefficient $\eta$ for each mask, accordingly, it is possible to enhance the line width uniformity in the vicinity of the value of $CD_0$ as shown in FIG. 13. In other words, it is also possible to adapt the CDs of the masks having different writing times to each other.

On the assumption of the above description, an electron beam writing method according to the present embodiment will be described below.

First of all, the control calculator 110 inputs correlation information F(CD) of a base dose BaseDose(CD) and CD (an example of first correlation information), correlation information G(CD) of a proximity effect correction coefficient $\eta$(CD) and the CD (an example of second correlation information), and a correlation between a time t and the CD (an inclination $\alpha$ in the case in which the CD is proportional to the time), and stores them in the magnetic disk device 146.

At Step S102, as a pattern data inputting step, the control calculator 110 inputs the pattern data 150 for writing a writing region. The pattern data 150 thus input are stored in the memory 130 or the magnetic disk device 146.

At Step S104, as a writing time predicting step, the writing data processing unit 120 according to an example of a time calculating unit creates shot data based on the pattern data 150 and calculates a writing time $t_w$ for writing the pattern data 150. In other words, the writing time required for writing a pattern is predicted. In the case in which the writing time is known, it may be input.

As a base dose acquiring step, next, a base dose after an optional time from a writing start in the writing time in case of writing of the pattern data 150 is acquired by using a correlation among the time t required from a writing start time, the predicted writing time $t_w$ and the base dose. As a proximity effect correction coefficient acquiring step, similarly, a proximity effect correction coefficient $\eta$ after the optional time from the writing start in the writing time in case of the writing of the pattern data 150 is acquired by using a correlation among the time t required from the writing start time, the predicted writing time $t_w$ and the proximity effect correction coefficient. More specifically, the base dose and the proximity effect correction coefficient $\eta$ are acquired in the following manner as an example.

At Step S106, as a parameter table creating step, the base dose acquiring unit 112 first reads the correlation information F(CD) between the base dose BaseDose(CD) and the CD from the magnetic disk device 146 and can obtain a correlation among the time t required from the writing start time, the predicted writing time $t_w$ and the base dose by the correlation information F(CD) and an equation defined with $cd(t)=CD_0+\alpha(t_w-t)$ in the case in which a definition is carried out with $cd(t)=CD_0+\alpha(t_w-t)$ obtained after the correction as described above. By using the correlation, a base dose BaseDose(t) corresponding to the CD after the optional time since the writing start time in case of the writing of the pattern data is obtained. $t_w$ represents a writing time for the pattern data 150. Similarly, the proximity effect correction coefficient acquiring unit 114 reads the correlation information G(CD) between the proximity effect correction coefficient $\eta$(CD) and the CD from the magnetic disk device 146, and can obtain a correlation among the time t required from the writing start time, the predicted writing time $t_w$ and the proximity effect correction coefficient with the correlation information G(CD) and an equation defined with $cd(t)=CD_0+\alpha(t_w-t)$. By using the correlation, a proximity effect correction coefficient η(t) corresponding to the CD after the optional time since the writing start time in case of the writing of the pattern data is obtained. The parameter table creating unit 122 creates a table for the base dose and the proximity effect correction coefficient η which are adapted to a predicting time required from the writing start.

FIG. 14 shows an example of a table according to the first embodiment.

As shown in FIG. 14, there is created a table for the base dose and the proximity effect correction coefficient η corresponding to each other every predicting time required from the writing start. A parameter table may be created and input before the writing. In a half time, moreover, it is suitable to determine the base dose and the proximity effect correction coefficient η through an interpolating calculation. In a subsequent calculation, furthermore, it is also possible to exactly use functions of BaseDose(t)=F{cd(t)} and η(t)=G{cd(t)} in which BaseDose(t) and the proximity effect correction coefficient η(t) are fitted as a function of t without creating the parameter table.

At Step S108, as a step of setting the base dose BaseDose(t) and the proximity effect correction coefficient η(t), the control calculating unit 110 determines and sets the base dose BaseDose(t) and the proximity effect correction coefficient η(t) at the time t after the writing start based on the created parameter table.

At Step S110, as a dose calculating step, the exposure dose calculating unit 116 calculates a dose after an optional time by using a base dose and a proximity effect correction coefficient after an optional time since the writing start.

FIG. 15 shows an equation for calculating a dose Dp obtained after a proximity effect correction according to the first embodiment.

As shown in FIG. 15, the dose Dp after the proximity effect correction can be obtained by using a base dose BaseDose(t), a proximity effect correction coefficient η(t), 0-order proximity effect correction data U(x, y), and i-order proximity effect correction data $V_i(x, y)$ (in case of i>0). Moreover, (x', y') represents coordinates in a workpiece plane. By adding first-order and succeeding terms for di defined by η(t), the 0-order proximity effect correction data U(x, y), and the i-order proximity effect correction data $V_i$, it is possible to calculate the amount of an exposure with higher precision. Moreover, it is possible to optionally set an order to be calculated within a range of a restriction of a calculating capability and a time. By carrying out a calculation to three-order, practically, it is possible to set a calculation error within a range of approximately 0.5%, which is more suitable.

Figure 16:
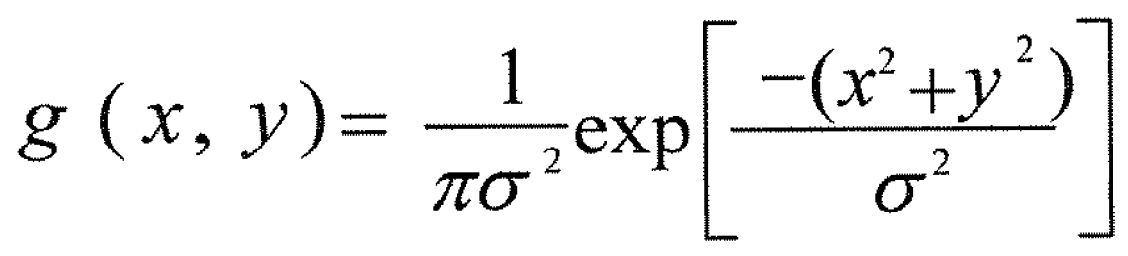

FIG. 16 shows an example of a distribution function equation g(x, y) according to the first embodiment.

By using FIG. 16, the 0-order proximity effect correction data U(x, y), and the i-order proximity effect correction data $V_i(x, y)$ are calculated.

At Step S112, as an irradiation time calculating step, the irradiation time calculating unit 118 calculates the irradiation time T of the electron beam 200 in a position after an optional time from a writing start in a writing region. The dose Dp can be defined by a product of the irradiation time T and a current density J. Therefore, it is possible to obtain the irradiation time T by dividing the dose Dp by the current density J.

At Step S114, as a writing step, the control calculator 110 outputs a signal to the deflection control circuit 140 in such a manner that a beam irradiation on the workpiece is turned OFF in the irradiation time T thus obtained, and the deflection control circuit 140 controls the blanking deflector 205 in order to deflect a charged particle beam corresponding to the irradiation time T thus obtained according to the signal. After the desirable dose D is irradiated on the workpiece 101, the electron beam 200 deflected by the blanking deflector 205 is shielded by the blanking aperture 206 in order not to reach the workpiece 101.

As described above, it is possible to reduce an error between pattern categories by changing BaseDose(t) and the proximity effect correction coefficient η(t) depending on a time. Moreover, it is possible to prevent a throughput from being deteriorated by a measurement of a film thickness, a reirradiation and the like. In the present embodiment, moreover, it is possible to obtain the dose for correcting a fluctuation in the line width dimension (CD) after the writing of the mask after an optional time from the writing start even if a film thickness measuring device, an exposure assisting chamber and the like are not provided in addition to the pattern for determining a corrected exposure amount and the exposing device body described in JP-A-2000-267259.

As described above, it is possible to obtain a base dose for correcting a dimension fluctuation amount from a time from a writing start time to the start of writing in an optional position in a writing region by using the correlation between the time required from the writing start time and the base dose. By using the correlation between the time from the writing start time and the proximity effect correction coefficient, it is possible to obtain a proximity effect correction coefficient for correcting a dimension fluctuation amount from a time required for starting the writing in the optional position in the writing region after the writing. As a result, it is possible to calculate a dose for correcting the dimension fluctuation amount in the optional position.

Second Embodiment

Figure 17:
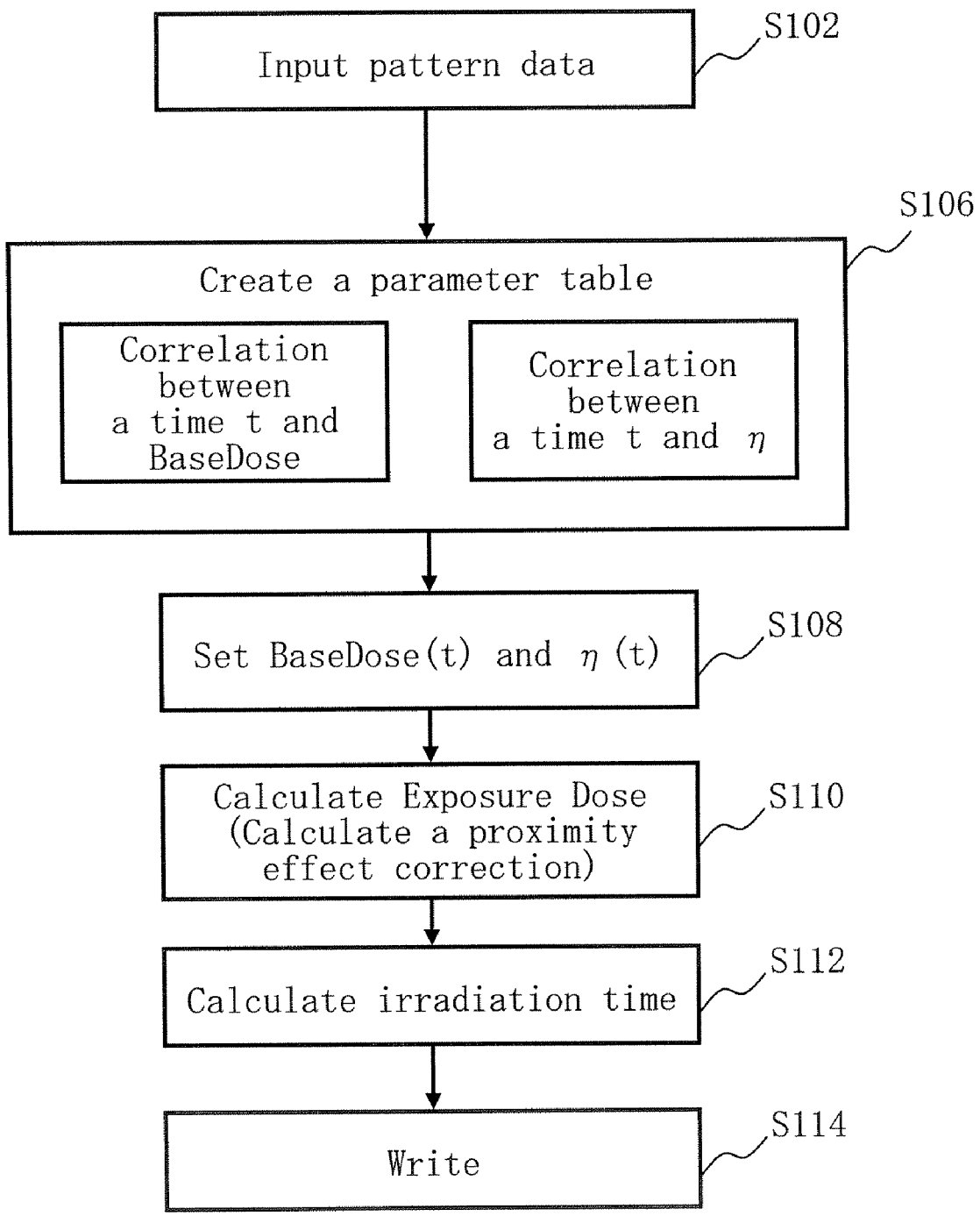
FIG. 17 is a flowchart showing steps of a main part in an electron beam writing method according to a second embodiment of the present invention.

FIG. 17 is a flowchart showing steps of a main part in an electron beam writing method according to a second embodiment.

In FIG. 17, the electron beam writing method executes a serial steps including a pattern data inputting step (S102), a parameter table creating step (S106) according to an example of a base dose acquiring step and a proximity effect correction coefficient acquiring step, a step (S108) of setting a base dose BaseDose(t) and a proximity effect correction coefficient η(t), a dose calculating step (S110), an irradiation time calculating step (S112) and a writing step (S114). FIG. 17 is the same as FIG. 1 except that the writing time predicting step (S104) is eliminated. Since the structure of an EB writing apparatus 100 may be the same as that in FIG. 2, moreover, description will be omitted.

In the first embodiment, there has been employed the structure in which the definition is carried out with $cd(t)=CD_0+\alpha(t_w-t)$ obtained after the correction and the base dose BaseDose(t) and the proximity effect correction coefficient η(t) are acquired in order to perform the CD correction. In the second embodiment, there is employed a structure in which the definition is carried out with $cd(t)=CD_{(t=0)}-\alpha \cdot t$ obtained after the correction described with reference to FIG. 9 and the base dose BaseDose(t) and the proximity effect correction coefficient η(t) are acquired. By carrying out the definition with $cd(t)=CD_{(t=0)}-\alpha \cdot t$ obtained after the correction, it is possible to omit the step of predicting the writing time tw of a mask pattern to be a target workpiece. As a result, it is possible to simplify a system.

Figure 18:
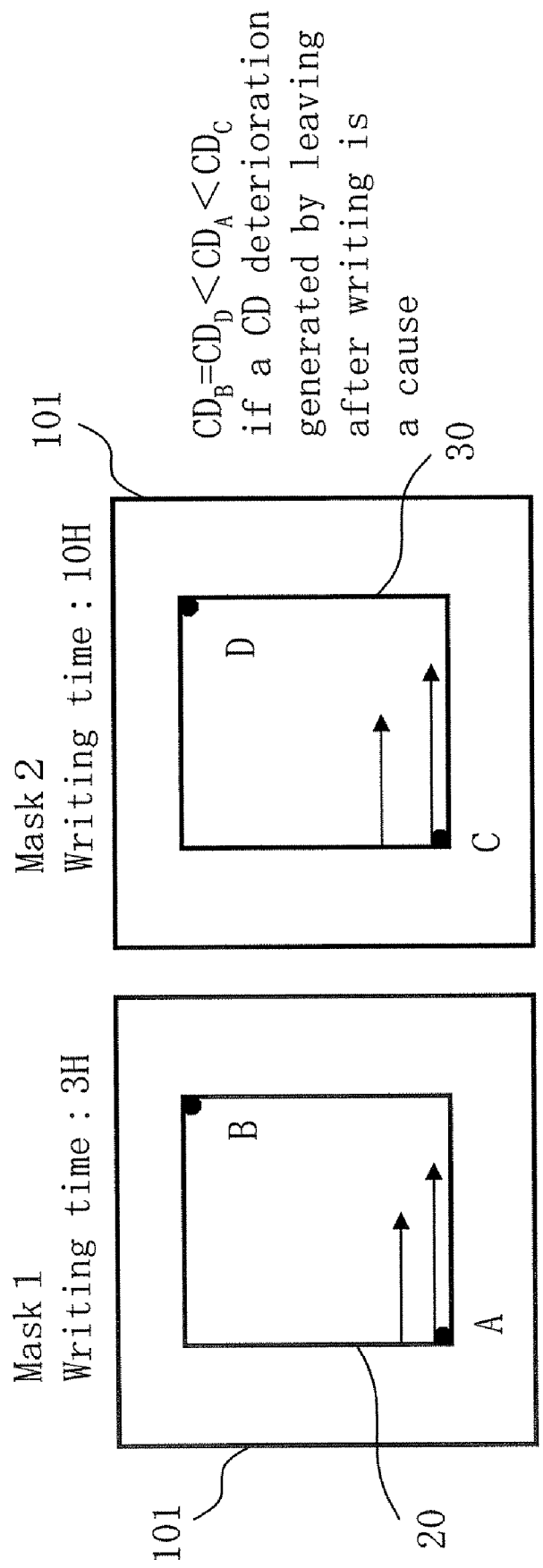
FIGS. 18A and 18B are diagrams for explaining a CD deterioration in the case in which masks having different writing times are written according to the second embodiment.

FIGS. 18A and 18B are views for explaining a CD deterioration in the case in which masks having different writing times are written according to the second embodiment.

FIG. 18A shows a mask 1 in which a writing time from a writing start point A to a writing end point B takes three hours. On the other hand, FIG. 11B shows a mask 2 in which a writing time from a writing start point C to a writing end point D takes 10 hours. If a CD deterioration generated by leaving after the writing is a cause, $CD_B = CD_D < CD_A < CD_C$ is obtained for a relationship among $CD_A$ to be a CD value obtained by leaving after the writing on a point A, $CD_B$ to be a CD value obtained by leaving after the writing on a point B, $CD_C$ to be a CD value obtained by leaving after the writing on a point C and $CD_D$ to be a CD value obtained by leaving after the writing on a point D. The contents are the same as those in FIGS. 11A and 11B.

Figure 19:
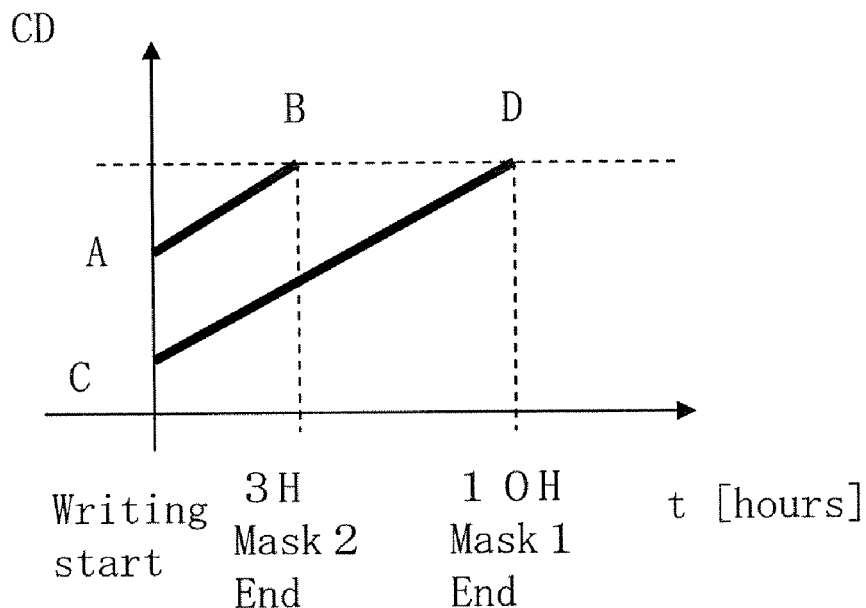
FIG. 19 is a chart showing an example of a graph representing a correlation between CDs of two masks and a time t required from a writing start in FIGS. 18A and 18B.

FIG. 19 is a chart showing an example of a graph representing a correlation between the CDs of two masks and the time t required from a writing start in FIGS. 18A and 18B.

As shown in FIG. 19, in the CD values on the points A to D before the correction, the point C where a leaving time is the longest takes the smallest CD value. The points B and D where the leaving time is zero take the same value. The contents are the same as those in FIG. 12.

Figure 20:
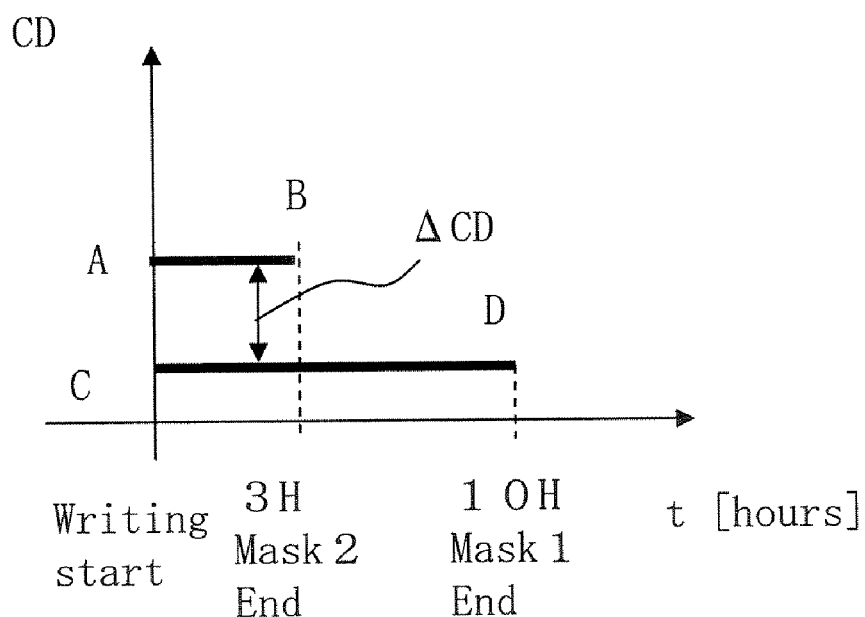
FIG. 20 is a chart showing an example of a graph representing a correlation between a pattern line width dimension CD obtained after a correction and the time t required from the writing start for the two masks in FIGS. 18A and 18B.

FIG. 20 is a chart showing an example of a graph representing a correlation between the pattern line width dimension CD obtained after the correction and the time t required from the writing start for the two masks in FIGS. 18A and 18B.

The definition can be carried out with $cd(t) = CD_{(t=0)} - \alpha \cdot t$ after a correction, wherein a value obtained after a correction for correcting each CD value is represented as cd(t), an inclination of the graph shown in FIG. 19 is represented as α, and the CD values on the points A and C where the time t required from a writing start is "0" are represented as $CD_{(t=0)}$ respectively. The base dose BaseDose(t) for writing cd(t) obtained after the correction can be defined with BaseDose(t)=F{cd(t)} based on the function F(CD) described with reference to FIG. 6. Similarly, the proximity effect correction coefficient η(t) for writing cd(t) obtained after the correction can be defined with the proximity effect correction coefficient η(t) =G{cd(t)} based on the function G(CD) described with reference to FIG. 6. In the case in which the writing is carried out in a dose obtained by calculating the base dose and the proximity effect correction coefficient η, it is possible to enhance the line width uniformity in the vicinity of the value of $CD_{(t=0)}$ on the point A for the mask 1 and in the vicinity of the value of $CD_{(t=0)}$ on the point C for the mask 2 as shown in FIG. 20. Herein, a difference of ΔCD is made between the two masks. In the case in which the ΔCD is smaller than a desired value of the CD difference between the masks, the second embodiment is particularly effective. Also in the case in which a difference in a writing time between the masks is small, the second embodiment is effective.

Third Embodiment

Figure 21:
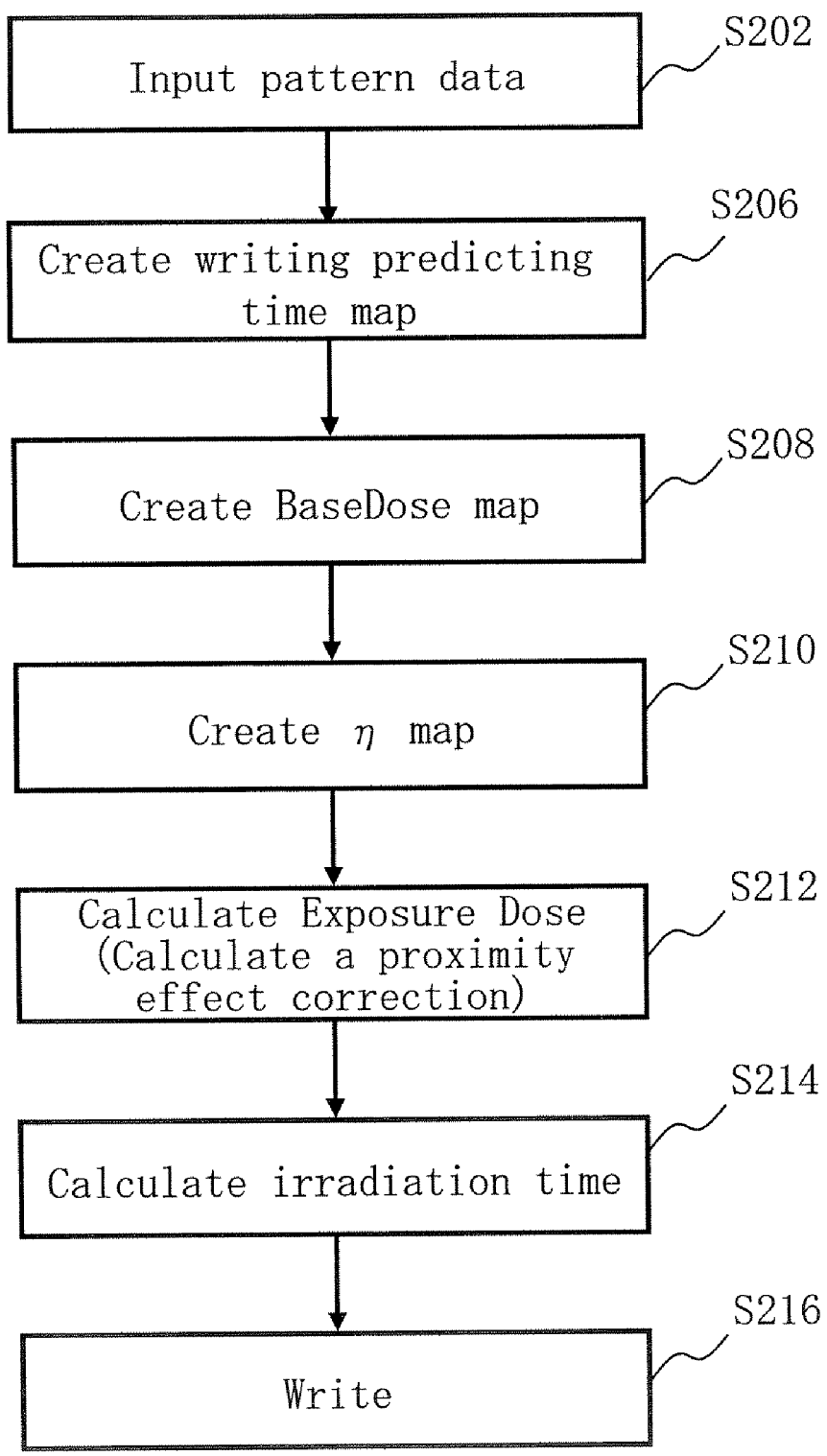
FIG. 21 is a flowchart showing steps of a main part in an electron beam writing method according to a third embodiment of the present invention.

FIG. 21 is a flowchart showing steps of a main part in an electron beam writing method according to a third embodiment of the present invention.

In FIG. 21, the electron beam writing method executes a serial steps including a pattern data inputting step (S202), a parameter table inputting step (S204), a writing predicting time map creating step (S206), a base dose map creating step (S208), a η map creating step (S210), a dose calculating step (S212), an irradiation time calculating step (S214), and a writing step (S216).

Figure 22:
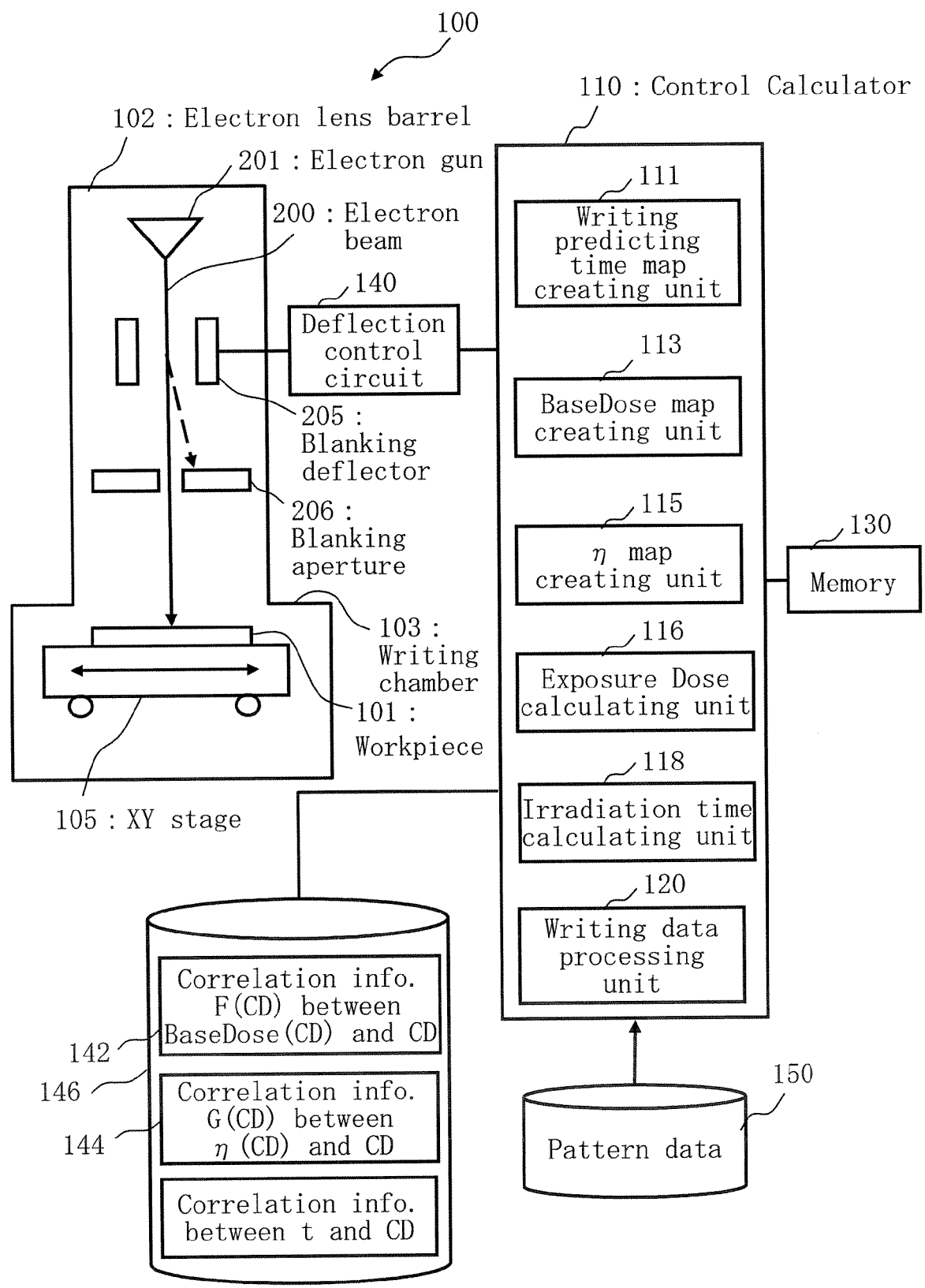
FIG. 22 is a conceptual diagram showing an example of a structure of a main part in an EB writing apparatus according to the third embodiment.

FIG. 22 is a conceptual diagram showing an example of a structure of a main part in an EB writing apparatus according to the third embodiment.

In FIG. 22, the control calculator 110 has the functions of a writing predicting time map creating unit 111, a base dose map creating unit 113, a η map creating unit 115, an exposure dose calculating unit 116, an irradiation time calculating unit 118, and a writing data processing unit 120. Since the other structures are the same as those in FIG. 2, description will be omitted. In FIG. 22, units other than necessary components for explaining the third embodiment are omitted. It is apparent that the EB writing apparatus 100 usually includes other necessary structures. Although FIG. 22 illustrates that the processing of each of the functions including the writing predicting time map creating unit 111, the base dose map creating unit 113, the η map creating unit 115, the exposure dose calculating unit 116, the irradiation time calculating unit 118 and the writing data processing unit 120 is executed in the control calculator 110 according to an example of a computer, moreover, this is not restricted but it may be executed by a combination of hardware and software through an electrical circuit. Alternatively, it is also possible to apply a combination of the hardware and firmware.

First of all, the control calculator 110 inputs correlation information F(CD) of a base dose BaseDose(CD) and CD (an example of first correlation information), correlation information G(CD) of a proximity effect correction coefficient η(CD) and the CD (an example of second correlation information), and a correlation between a time t and the CD (an inclination α in the case in which the CD is proportional to the time), and stores them in the magnetic disk device 146.

At Step S202, as a pattern data inputting step, the control calculator 110 inputs the pattern data 150 for writing a writing region, The pattern data 150 thus input are stored in the memory 130 or the magnetic disk device 146.

At Step S206, as a writing predicting time map creating step, the writing predicting time map creating unit 111 first divides a writing region to be a virtual dividing step virtually into meshes in a predetermined dimension. Based on the pattern data 150, then, a predicting time map from a writing start time to a start of writing for each mesh region in the writing region is created.

Figure 23:
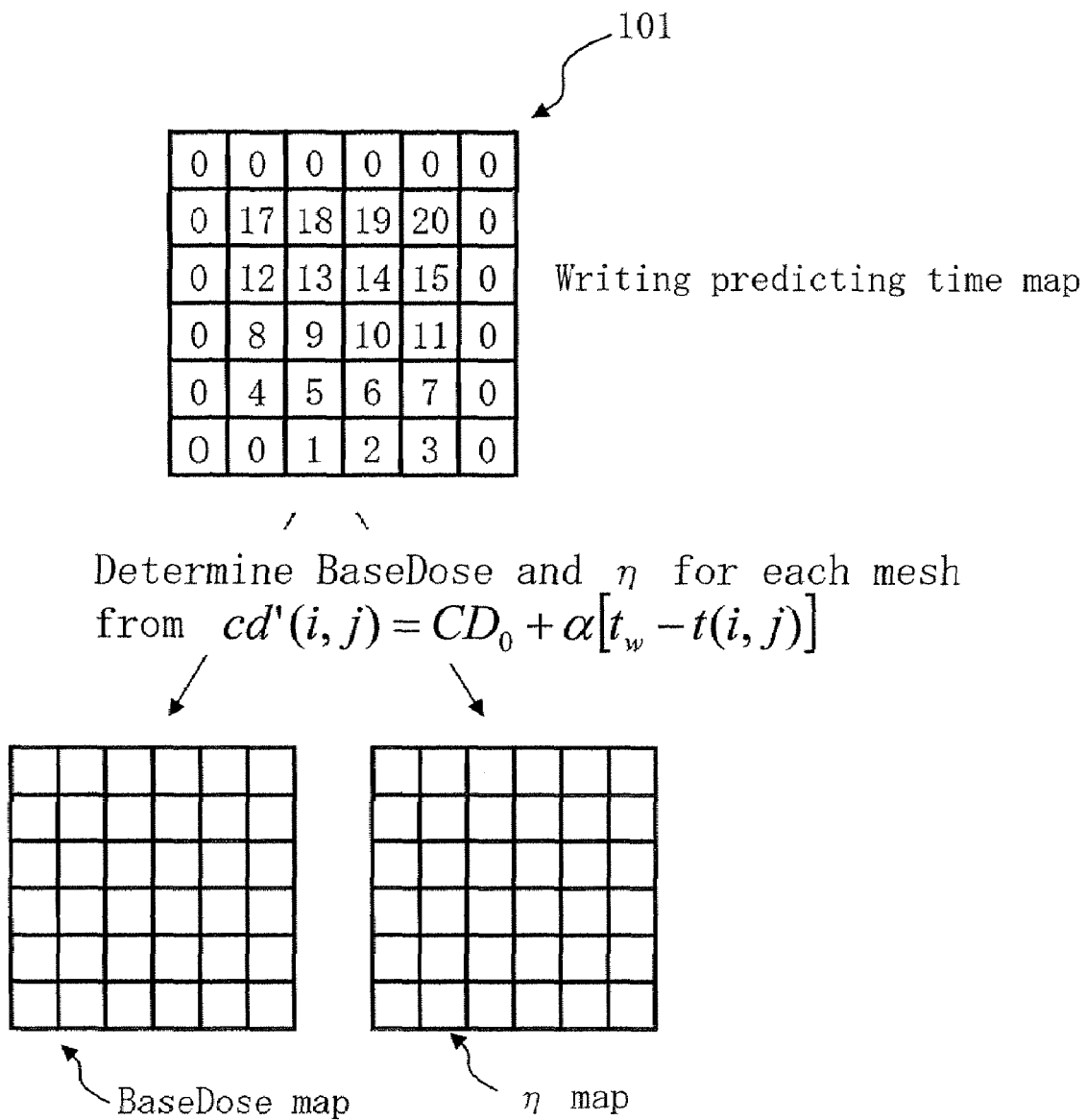
FIG. 23 is a conceptual diagram for explaining a map creation according to the third embodiment.

FIG. 23 is a conceptual view for explaining a map creation according to the third embodiment.

As shown in FIG. 23, a writing region of a workpiece 101 is virtually divided into meshes in a predetermined dimension, a time t of each mesh region from a writing start is predicted and a map for each mesh (a writing predicting time map) is thus created.

At Step S208, as a base dose map creating step, the base dose map creating unit 113 creates a base dose map in each mesh region in the case in which the pattern data 150 are drawn based on a correlation between a time required from a writing start time to a base dose. A definition can be carried out with $cd'(i, j) = CD_0 + \alpha\{t_w - t(i, j)\}$ after a correction, wherein a value obtained after a correction for correcting each CD value of a pattern for writing each mesh region is represented as cd'(i, j), an inclination of a graph of the CD value for the writing time t is represented as α, a CD value in a leaving time of "0" after a writing end is represented as $CD_0$, and a time required for writing all of the mesh regions is represented as $t_w$. (i, j) represents coordinates in the mesh region. The function F(CD) described with reference to FIG. 6 is read from the magnetic disk device 146 so that the base dose BaseDose(i, j) for writing cd'(i, j) obtained after the correction can be defined with BaseDose(i, j)=F{cd'(i, j)}. By using the correlation, the base dose map is created in each mesh region as shown in FIG. 23.

At Step S210, as a η map creating step, the η map creating unit 115 creates a η map in each mesh region in the case in which the pattern data 150 are drawn based on the correlation between the time t required from the writing start time and the proximity effect correction coefficient η. In the same manner as in the case in which the base dose map is created, the function G(CD) described with reference to FIG. 6 is read from the magnetic disk device 146 so that the proximity effect correction coefficient η(i, j) for writing cd'(i, j) obtained after the correction can be defined with the proximity effect correction coefficient η(i, j)=G{cd'(i, j)}. By using the correlation, the η map is created in each mesh region as shown in FIG. 23.

By creating the predicting time map as described above, it is possible to obtain the BaseDose(i, j) for correcting a dimension fluctuation amount from a time from the writing start time to the start for the writing in each mesh region by using the correlation between the time required from the writing start time and the base dose. By using the correlation between the time required from the writing start time and the proximity effect correction coefficient, it is possible to obtain η(i, j) for correcting the dimension fluctuation amount from the time from the writing start time to the start for the writing in each mesh region. As a result, it is possible to create position depending base dose map and η map depending on the position of each mesh region in the writing region from a time dependency.

At Step S212, as a dose calculating step, the exposure dose calculating unit 116 calculates a dose Dp in each mesh region by using the base dose map and the η map. Referring to an equation for calculating the dose Dp, it is preferable that the time t should be replaced with the mesh coordinates (i, j) in the equation shown in FIG. 15.

At Step S214, as an irradiation time calculating step, the irradiation time calculating unit 118 calculates the irradiation time T of the electron beam 200 in the position of each mesh region in the writing region. The dose Dp can be defined by a product of the irradiation time T and a current density J. Therefore, it is possible to obtain the irradiation time T by dividing the dose Dp by the current density J.

At Step S216, as a writing step, the control calculator 110 outputs a signal to the deflection control circuit 140 in such a manner that a beam irradiation on the workpiece is turned OFF in the irradiation time T thus obtained, and the deflection control circuit 140 controls the blanking deflector 205 in order to deflect a charged particle beam corresponding to the irradiation time T thus obtained according to the signal. After the desirable dose Dp is irradiated on the target workpiece 101, the electron beam 200 deflected by the blanking deflector 205 is shielded by the blanking aperture 206 in order not to reach the target workpiece 101.

When a writing time is set to be 20 hours, a stripe width obtained by virtually dividing the workpiece 101 like a strip having a width within a range in which a deflection can be carried out is set to be 500 μm and a writing region is set to be 150 mm square, a writing time per stripe is four minutes and a writing speed is 1 nm/h. On the condition, a CD error is 0.06 nm. The CD error of 0.06 nm is a tolerance. Accordingly, it is preferable that a mesh size should be almost equal to the stripe width.

By creating the predicting time map as described above, it is possible to obtain the base dose for correcting a dimension fluctuation amount from a time from the writing start time to the start for the writing in each mesh region by using the correlation between the time required from the writing start time and the base dose. By using the correlation between the time required from the writing start time and the proximity effect correction coefficient, it is possible to obtain the proximity effect correction coefficient for correcting the dimension fluctuation amount from the time from the writing start time to the start for the writing in each mesh region by using the correlation between the time required from the writing start time and the proximity effect correction coefficient. As a result, it is possible to create a base dose map and a proximity effect correction coefficient map which are finely divided into mesh regions. By creating the base dose map and the proximity effect correction coefficient map, it is possible to obtain a dose corrected in each mesh region.

According to the embodiments described above, it is possible to obtain the dose for correcting the line width dimension (CD) fluctuation obtained after the writing of the mask after an optional time from the writing start. By carrying out the writing in the dose, it is possible to correct the line width dimension (CD) fluctuation caused by leaving after the writing.

In the above description, the processing contents or operation contents described as " . . . unit" or " . . . step" can be constituted by a program which can be operated by a computer. Alternatively, it is also possible to execute them by a combination of hardware and software in addition to a program to be the software. Alternatively, it is also possible to apply a combination with firmware. In the case in which a structure is applied by a program, moreover, a program is recorded on a recording medium such as a magnetic disk device, a magnetic tape device, an FD or an ROM (Read Only Memory). For example, the program is recorded on the magnetic disk device 146.

In FIG. 2 or 22, moreover, the control calculator 110 to be a computer may be further connected to an RAM (Random Access Memory), an ROM or a magnetic disk (HD) device according to an example of a storage device, a keyboard (K/B) or a mouse according to an example of input means, a monitor or a printer according to an example of output means, an external interface (I/F), an FD, a DVD or a CD according to an example of input/output means, or the like.

The embodiments have been described above with reference to the specific examples. However, the present invention is not restricted to these specific examples. While the description has been given on the assumption that BaseDose(t) and η(t) are set to be a linear function of the time t as shown in FIG. 7 in each of the embodiments, for example, this is not restricted but other functions may be properly used depending on the characteristic of a resist. For example, it is also possible to define them as a quadric like BaseDose(t)=a·t²+b·t+c and η(t)=a'·t²+b'·t+c'. Alternatively, it is also possible to define them as an exponential function like BaseDose(t)=d+f·exp(−t/T) and η(t)=d'+f'·exp(−t/T'). Coefficients a, b, c, a', b', c', d, f, T, d', f' and T' and the like are constants to be varied depending on the characteristic of the resist. It is desirable that these definitions should be optimized from the result of the experiment for the time characteristic of the CD to be previously checked which has been described in each of the embodiments. In the writing apparatus, the values of the coefficients (parameters) and the equations which are thus optimized are stored in the form of a program in a hard disk, for example. Referring to the writing, it is preferable to calculate BaseDose(t) and η(t) by substituting the parameter values for the equations.

While BaseDose(t) and η(t) are obtained in approximate expressions to be relational equations in each of the embodiments, moreover, these approximate expressions are not used but values of optimum BaseDose(t) and η(t) at a certain time are obtained by experiments and the experimental data are set into a table and the like to be stored in a hard disk, for example. Referring to the writing, the value may be obtained by referring to the table. Moreover, the value may be obtained by an interpolation if necessary.

Figure 24:
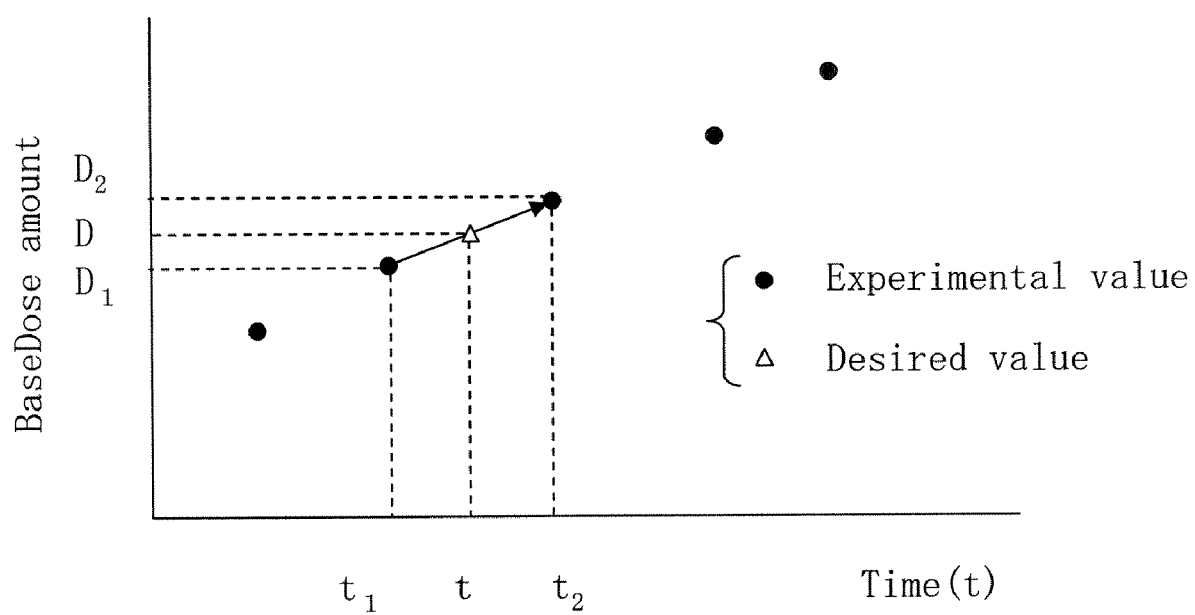
FIG. 24 is a chart for explaining the case in which a value is obtained by an interpolation.
Figure 25:
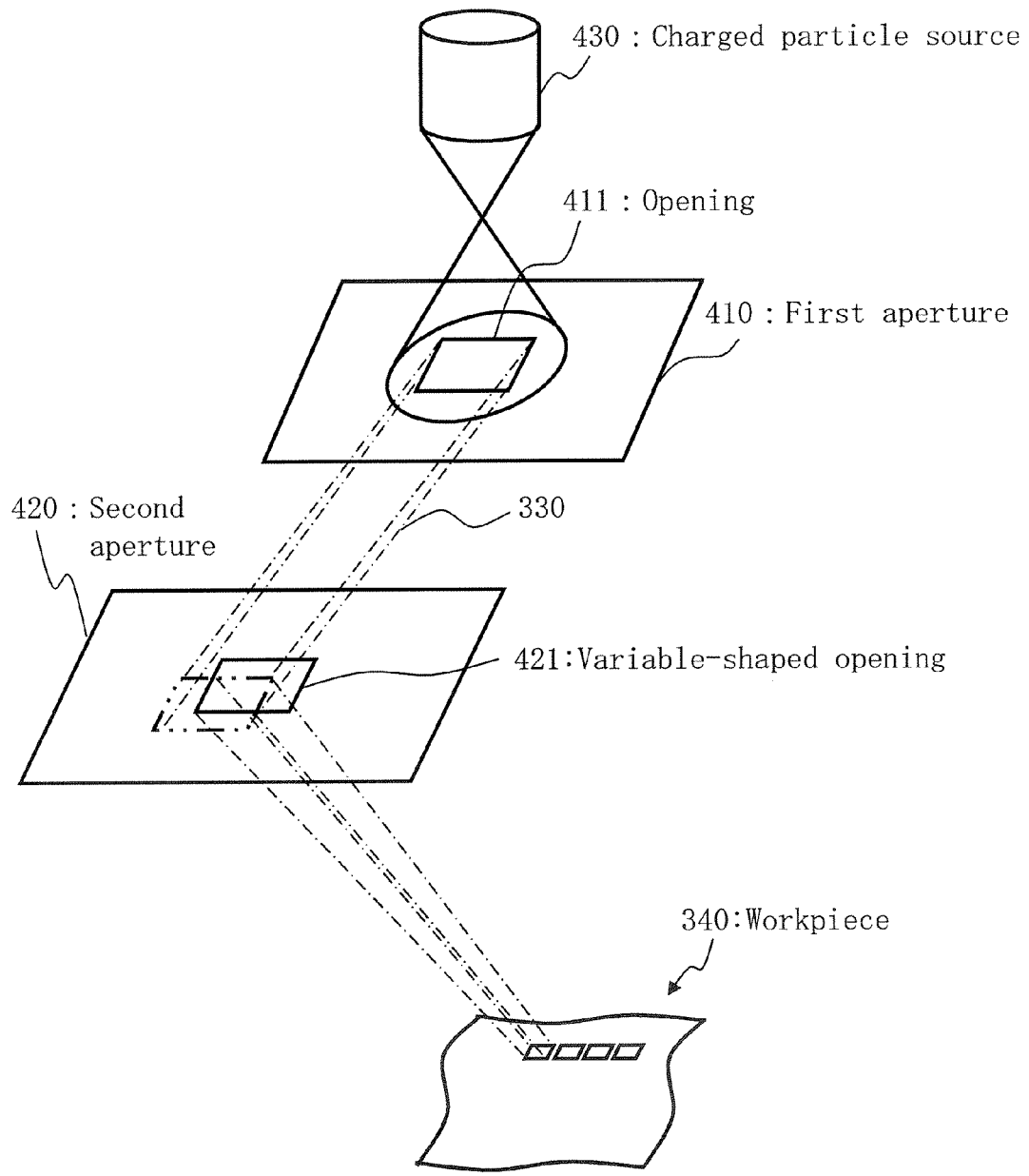
FIG. 25 is a conceptual view for explaining an operation of a conventional variable-shaped electron beam writing apparatus.

FIG. 24 is a chart for explaining the case in which the value is obtained by the interpolation.

FIG. 24 shows the case in which BaseDose(t) at a time t between a time $t_1$ and a time $t_2$ is obtained by the interpolation. In such a case, it is preferable that the BaseDose(t) should be obtained by using the time $t_1$ and $D_1$ to be BaseDose($t_1$) at that time and the time $t_2$ and $D_2$ to be BaseDose($t_2$) at that time. More specifically, the BaseDose(t) is obtained in BaseDose $(t)=(t-t_1)/(t_2-t_1)\cdot(D_2-D_1)+D_1$. While the BaseDose(t) has been described in FIG. 24, η(t) can be obtained in the same manner.

While the units which are not directly necessary for the description of the present invention, for example, the structure of the apparatus and the control methods have not been described, moreover, it is possible to properly select and use structures of the apparatus and control methods which are required. Although the detailed description of the structure of the control unit for controlling the EB writing apparatus 100 has been omitted, for example, it is apparent that the structures of the control units which are required are selected and used properly.

In addition, all of charged particle beam dose calculating methods, charged particle beam writing methods, programs for causing a computer to execute them, and their charged particle beam writing apparatuses which comprise the elements according to the present invention and can be properly designed and changed by those skilled in the art are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing method comprising:
    inputting pattern data for writing a writing region;
    predicting a writing time for writing the pattern of the pattern data;
    acquiring a first base dose of a charged particle beam at a writing start;
    acquiring a second base dose of the charged particle beam after a time interval from the writing start, in the case in which the pattern is written, using a correlation among a time required from a writing start time, the predicted writing time and the first base dose of the charged particle beam;
    acquiring a first proximity effect correction coefficient at the writing start;
    acquiring a second proximity effect correction coefficient after a time interval from the writing start, in the case in which the pattern is written, using a correlation among the time required from the writing start time, the predicted writing time and the first proximity effect correction coefficient;
    calculating an exposure dose of the charged particle beam after the time interval from a writing start in the writing time using the second base dose and the second proximity effect correction coefficient; and
    writing an instant writing position in the writing region by using the charged particle beam corresponding to the exposure dose,
    wherein the correlation between the time required from the writing start time and the first base dose is obtained based on a relationship between a leaving time after writing and a pattern line width changed by the leaving time and a relationship between the pattern line width and the first base dose.

2. The charged particle beam writing method according to claim 1, wherein the second base dose after the time interval is acquired based on a value of experimental data to be the correlation between the time required from the writing start time and the first base dose.

3. The charged particle beam writing method according to claim 2, wherein in the case in which the second base dose after the time interval is not present in the value of experimental data, the first base dose is obtained by an interpolation using the value of experimental data.

4. The charged particle beam writing method according to claim 2, wherein a table is created based on the experimental data, and the second base dose after the time interval is obtained by referring the table.

5. A charged particle beam writing method comprising:
    inputting pattern data for writing a writing region;
    predicting a writing time for writing the pattern of the pattern data;
    acquiring a first base dose of a charged particle beam at a writing start;
    acquiring a second base dose of The charged particle beam after a time interval from a writing start in the case, in which the pattern is written, using a correlation among a time required from a writing start time, the predicted writing time and the first base dose of the charged particle beam;
    acquiring a first proximity effect correction coefficient at the writing start;
    acquiring a second proximity effect correction coefficient after the time interval from the writing start in the case, in which the pattern is written, using a correlation among the time required from the writing start time, the predicted writing time and the first proximity effect correction coefficient;
    calculating an exposure dose of the charged particle beam after the time interval from a writing start in the writing time using the second base dose and the second proximity effect correction coefficient after the time interval; and
    writing an instant writing position in the writing region by using the charged particle beam corresponding to the exposure dose,
    wherein the correlation between the time required from the writing start time and the first proximity effect correction coefficient is obtained based on a relationship between a leaving time after writing and a pattern line width changed by the leaving time and a relationship between the pattern line width and the first proximity effect correction coefficient.

6. The charged particle beam writing method according to claim 5, wherein the second proximity effect correction coefficient after the time interval is acquired based on a value of experimental data to be the correlation between the time required from the writing start time and the first proximity effect correction coefficient.

7. The charged particle beam writing method according to claim 6, wherein in the case in which the second proximity effect correction coefficient after the time interval is not present in the value of experimental data, the first proximity effect correction coefficient is obtained by an interpolation using the value of experimental data.

8. The charged particle beam writing method according to claim 6, wherein a table is created based on the value of experimental data, and the second proximity effect correction coefficient after the time interval is obtained by referring the table.

9. A charged particle beam writing method comprising:
inputting pattern data for writing a writing region;
virtually dividing the writing region like a mesh in a predetermined dimension;
creating a predicting time map required for starting writing of each mesh region in the writing region from a writing start time based on the pattern data;
creating a base dose map in the each mesh region in the case in which the pattern is written based on a correlation between a time required from the writing start time and a base dose of a charged particle beam;
creating a proximity effect correction coefficient map in the each mesh region in the case in which the pattern is written based on a correlation between the time required from the writing start time and a proximity effect correction coefficient;
calculating an exposure dose in the each mesh region by using the base dose map and the proximity effect correction coefficient map; and
writing the each mesh region by using the charged particle beam corresponding to the dose,
wherein the correlation between the time required from the writing start time and the proximity effect correction coefficient is obtained based on a relationship between a leaving time after writing and a pattern line width changed by the leaving time and a relationship between the pattern line width and the proximity effect correction coefficient.

10. The charged particle beam writing method according to claim 9, wherein the correlation between the time required from the writing start time and the base dose is obtained based on a relationship between a leaving time after writing and a pattern line width changed by leaving and a relationship between the pattern line width and the base dose.

11. The charged particle beam writing method according to claim 9, wherein the correlation between the time required from the writing start time and the base dose is obtained based on a value of experimental data to be the correlation between the time required from the writing start time and the base dose.

12. The charged particle beam writing method according to claim 9, wherein the correlation between the time required from the writing start time and the proximity effect correction coefficient is obtained based on a value of experimental data to be the correlation between the time required from the writing start time and the proximity effect correction coefficient.

13. A computer readable storage medium storing thereon a program for causing a computer to execute;
a storage processing for storing, in a storage device, first correlation information of a pattern line width and a first base dose of a charged particle beam and second correlation information of the pattern line width and a first proximity effect correction coefficient;
an input processing for inputting pattern data to write a writing region;
a time calculation processing for calculating a writing time to write the pattern based on the pattern data;
a base dose acquirement processing for reading the first correlation information from the storage device and acquiring a second base dose corresponding to the pattern line width after a time interval required from a writing start in the writing time in the case in which the pattern is written;
a proximity effect correction coefficient acquirement processing for reading the second correlation information from the storage device and acquiring a second proximity effect correction coefficient corresponding to the pattern line width after the time interval required from a writing start in the writing time in the case in which the pattern is written; and
an exposure dose calculation processing for calculating an exposure dose after the time interval by using the second base dose and the second proximity effect correction coefficient corresponding to the pattern line width after the time interval,
wherein the pattern line width after the time interval required from a writing start is obtained based on a relationship between a leaving time after writing and a pattern line width changed by the leaving time.

14. A charged particle beam writing apparatus comprising:
a writing time predicting unit for predicting, based on the pattern data for writing a writing region, a writing time to write pattern of the pattern data by using a charged particle beam;
a base dose acquiring unit for acquiring a first base dose of the charged particle beam at a writing start and for acquiring a second base dose of the charged particle beam after a time interval from the writing start, in the case in which the pattern of the pattern data is written, using a correlation among a time required from a writing start time, the predicted writing time and the first base dose of the charged particle beam;
a proximity effect correction coefficient acquiring unit for acquiring a first proximity effect correction coefficient at the writing start and for acquiring a second proximity effect correction coefficient after the time interval from the writing start, in the case in which the pattern is written, using a correlation between the time required from the writing start time, the predicted writing time and the first proximity effect correction coefficient;
an exposure dose calculating unit for calculating an exposure dose after the time interval by using the second base dose and the second proximity effect correction coefficient after the time interval;
an irradiation time calculating unit for calculating an irradiation time of the charged particle beam in each position in the writing region based on the exposure dose;
a deflector for deflecting the charged particle beam corresponding to the irradiation time; and
an aperture for shielding the charged particle beam deflected by the deflector,
wherein the correlation between the time required from the writing start time and the proximity effect correction coefficient is obtained based on a relationship between a leaving time after writing and a pattern line width changed by the leaving time and a relationship between the pattern line width and the first proximity effect correction coefficient.

15. The charged particle beam writing method according to claim 5, wherein the correlation between the time required from the writing start time and the first base dose is obtained based on a relationship between a leaving time after writing and a pattern line width changed by the leaving time and a relationship between the pattern line width and the first base dose.

* * * * *